US009448384B2

(12) United States Patent
Erath et al.

(10) Patent No.: US 9,448,384 B2
(45) Date of Patent: Sep. 20, 2016

(54) ARRANGEMENT FOR MOUNTING AN OPTICAL ELEMENT

(71) Applicant: Carl Zeiss SMT GmbH, Oberkochen (DE)

(72) Inventors: Michael Erath, Dietenheim (DE); Florian Bach, Oberkochen (DE); Ulrich Schoenhoff, Neu-Ulm (DE); Rodolfo Rabe, Aalen-Himmlingen (DE); Norbert Muehlberger, Aalen-Ebnat (DE); Dirk Eicher, Schorndorf (DE); Jasper Wesselingh, Moettingen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 454 days.

(21) Appl. No.: 13/903,563

(22) Filed: May 28, 2013

(65) Prior Publication Data

US 2013/0314681 A1  Nov. 28, 2013

Related U.S. Application Data

(63) Continuation of application No. PCT/EP2011/072870, filed on Dec. 15, 2011.

(60) Provisional application No. 61/424,823, filed on Dec. 20, 2010, provisional application No. 61/424,855, filed on Dec. 20, 2010.

(30) Foreign Application Priority Data

Dec. 20, 2010  (DE) .................... 10 2010 063 566
Dec. 20, 2010  (DE) .................... 10 2010 063 577

(51) Int. Cl.
*G02B 7/182* (2006.01)
*G02B 7/02* (2006.01)
(Continued)

(52) U.S. Cl.
CPC ............ *G02B 7/1828* (2013.01); *G02B 7/023* (2013.01); *G03F 7/708* (2013.01); *G03F 7/70141* (2013.01); *G03F 7/70825* (2013.01); *G02B 3/00* (2013.01); *G02B 5/08* (2013.01)

(58) Field of Classification Search
CPC . G02B 7/023; G02B 7/1828; G03F 7/70141; G03F 7/708; G03F 7/70825
See application file for complete search history.

(56) References Cited

U.S. PATENT DOCUMENTS 6,952,254 B2    10/2005  Korenaga
7,046,335 B2     5/2006  Miyajima
(Continued)

FOREIGN PATENT DOCUMENTS

DE    10 2009 054 549      6/2010
EP     1 001 512 A2        5/2000
(Continued)

OTHER PUBLICATIONS

German Office Action, with translation thereof, for corresponding DE Appl No. 10 2010 063 577.4, dated Apr. 5, 2011.
(Continued)

*Primary Examiner* — Michelle M Iacoletti
(74) *Attorney, Agent, or Firm* — Fish & Richardson P.C.

(57) ABSTRACT

The invention relates to an arrangement for mounting an optical element, in particular in an EUV projection exposure apparatus, comprising a weight force compensation device for exerting a compensation force on the optical element, wherein the compensation force at least partly compensates for the weight force acting on the optical element, wherein the weight force compensation device has a passive magnetic circuit for generating a force component of the compensation force acting on the optical element, and wherein at least one adjustment element is provided via which the force component generated by the passive magnetic circuit is continuously adjustable.

27 Claims, 15 Drawing Sheets

(51) Int. Cl.
*G03F 7/20* (2006.01)
*G02B 3/00* (2006.01)
*G02B 5/08* (2006.01)

(56) References Cited

U.S. PATENT DOCUMENTS

| | | | |
|---|---|---|---|
| 7,183,674 | B2 | 2/2007 | Koorneef et al. |
| 7,221,463 | B2 | 5/2007 | Mizuno et al. |
| 7,283,210 | B2 | 10/2007 | Hazelton |
| 7,462,958 | B2 | 12/2008 | Hazelton |
| 2003/0052284 | A1 | 3/2003 | Hol et al. |
| 2004/0135468 | A1 | 7/2004 | De Weerdt et al. |
| 2004/0179192 | A1 | 9/2004 | Mizuno et al. |
| 2005/0140962 | A1 | 6/2005 | Ottens et al. |
| 2005/0248860 | A1 | 11/2005 | Soemers et al. |
| 2008/0055756 | A1 | 3/2008 | Ishikawa |
| 2009/0040638 | A1 | 2/2009 | Van Deuren et al. |
| 2009/0207511 | A1 | 8/2009 | Schoeppach et al. |
| 2011/0267596 | A1 | 11/2011 | Muehlberger et al. |

FOREIGN PATENT DOCUMENTS

| | | |
|---|---|---|
| EP | 1 424 767 | 6/2004 |
| EP | 1 720 068 | 11/2006 |
| JP | 03-028812 A | 2/1991 |
| JP | 2003-077830 A | 3/2003 |
| JP | 2004-186687 A | 7/2004 |
| JP | 2007-515799 A | 6/2007 |
| WO | WO 2005/026801 | 3/2005 |
| WO | WO 2006/046101 | 5/2006 |
| WO | WO 2006/046507 | 5/2006 |
| WO | WO 2009/093907 | 7/2009 |
| WO | WO 2010/066873 | 6/2010 |
| WO | WO 2012/143275 | 10/2012 |

OTHER PUBLICATIONS

German Office Action, with translation thereof, for corresponding DE Appl No. 10 2010 063 566.9 dated Apr. 13, 2011.

Research Disclosure Database No. 557018, "Magnetic gravity compensator with integrated Lorentz actuator and flux steering permanent magnet poles," Kenneth Mason Publications Ltd, published Sep. 2010.

International Search Report an Written Opinion for corresponding PCT Appl No. PCT/EP2011/072870, dated Mar. 29, 2012.

International Preliminary Report on Patentability for corresponding PCT App. No. PCT/EP2011/072870, dated Jun. 25, 2013.

Japanese Office Action, with translation thereof, for corresponding JP Appl No. 2013-545207, dated Oct. 7, 2015.

ARRANGEMENT FOR MOUNTING AN OPTICAL ELEMENT

CROSS REFERENCE TO RELATED APPLICATIONS

The present application is a continuation of, and claims benefit under 35 USC 120 to, international application PCT/EP2011/072870, filed Dec. 15, 2011, which claims benefit under 35 USC 119 of German Patent Applications DE 10 2010 063 566.9 and DE 10 2010 063 577.4, both filed on Dec. 20, 2010, and under 35 USC 119(e) of U.S. 61/424,823 and U.S. 61/424,855, both also filed on Dec. 20, 2010. The content of these applications is hereby incorporated by reference.

BACKGROUND OF THE INVENTION

1. Field of the Invention

The invention relates to an arrangement for mounting an optical element, in particular in an EUV projection exposure apparatus.

2. Prior Art

Microlithography is used to produce microstructured components such as, for example, integrated circuits or LCDs. The microlithography process is carried out in a so-called projection exposure apparatus having an illumination device and a projection lens. The image of a mask (=reticle) illuminated via the illumination device is in this case projected via the projection lens onto a substrate (e.g. a silicon wafer) coated with a light-sensitive layer (photoresist) and arranged in the image plane of the projection lens, in order to transfer the mask structure to the light-sensitive coating of the substrate.

In a projection exposure apparatus designed for EUV (i.e. for electromagnetic radiation having a wavelength of less than 15 nm), owing to light-transmissive materials not being present, mirrors are used as optical components for the imaging process. The mirrors can be fixed e.g. on a carrier frame and can be configured such that they are at least partly manipulatable, in order to enable a movement of the respective mirror in six degrees of freedom (i.e. with regard to displacements in the three spatial directions x, y and z and also with regard to rotations $R_x$, $R_y$ and $R_z$ about the corresponding axes). In this case, it is possible to compensate for changes in the optical properties that occur for instance during the operation of the projection exposure apparatus e.g. on account of thermal influences.

WO 2005/026801 A2 discloses, inter alia, using three actuator devices in a projection lens of an EUV projection exposure apparatus for the manipulation of optical elements such as mirrors in up to six degrees of freedom, the actuator devices each having at least two Lorentz actuators and two actively drivable movement axes. The Lorentz actuators each have two elements which are separated via a gap and one of which has a solenoid, to which an electric current can be applied in order to alter the gap, such that the two elements of the Lorentz actuator, of which one is connected to the respective optical element or mirror and the other is connected to the housing of the projection lens, can be moved relative to one another, wherein the two elements of the Lorentz actuator are mechanically decoupled on account of the gap situated between them. Furthermore, a weight force compensation device embodied as a spring element, for example, is provided in order to minimize the energy consumption of the active or controllable actuating elements, since the weight force compensation device substantially carries the mass of the optical element or mirror, such that no permanent energy flow with associated generation of heat is necessary in this respect. The weight force compensation device (also designated as "MGC") can be set to a certain holding force that is transmitted to the mirror via a mechanical element (pin) that couples mechanically to the mirror.

SUMMARY OF THE INVENTION

It is an object of the present invention to provide an arrangement for mounting an optical element, in particular in an EUV projection exposure apparatus, which enables an improved weight force compensation of the optical element while also reducing or minimizing the requirement for additional actuator forces and resulting thermal loads for a positioning of the optical element.

In accordance with one aspect of the present disclosure, an arrangement for mounting an optical element, in particular in an EUV projection exposure apparatus, comprises:
 a weight force compensation device for exerting a compensation force on the optical element, wherein the compensation force at least partly compensates for the weight force acting on the optical element;
 wherein the weight force compensation device has a passive magnetic circuit for generating a force component of the compensation force acting on the optical element; and
 wherein at least one adjustment element is provided by which the force component generated by the passive magnetic circuit is continuously adjustable.

According to this aspect the invention is based on the concept to continuously manipulate, by an adjusting element, the magnetic field lines generated by the passive magnetic circuit (which can comprise for example, as further described in the following, two movable inner magnets and one fixed outer magnet), and thereby to continuously manipulate the force component generated by the passive magnetic circuit in order to realize a continuous adjustability of the total resulting compensation force exerted by the weight force compensation device.

Further advantages which can be achieved using the adjusting element according to the invention comprise a possible reduction of a stray magnetic field as well as an enhancement of the efficiency of an actuator (such as e.g. a Lorentz-Actuator), which can be integrated into the weight force compensation device according to the present disclosure and as further described below.

According to an embodiment, the adjusting element is axially displaceable relative to the direction of the compensation force, wherein the force component generated by the passive magnetic circuit can be manipulated by the displacement.

The adjusting element can e.g. (without the invention being restricted thereto) be made of a soft-magnetic material. A soft-magnetic material denotes, here and in the following, a material which has a coercive field strength of less than 1000 A/m. Any suitable soft-magnetic materials can be used, such as e.g. iron (Fe), cobalt (Co) or Nickel (Ni), or alloys of the before-mentioned or other materials.

According to an embodiment the adjustment element can comprise at least one permanent magnet. In further embodiments, the adjustment element comprises at least one coil to which an electric current can be applied. By such a current-carrying coil, the magnetic properties of the passive magnetic circuit can be manipulated. Such a coil can be used, if carrying an electric direct current, to generate a constant magnetic field that is superimposed on the magnetic field generated by the passive magnetic circuit. Furthermore, such a coil can be used, via impulse-like current-application with of relatively short duration (e.g. with pulse duration of less than 1 ms) with a relatively large electric current (e.g. larger than 50 A), in order to permanently modify the magnetic properties (in particular the remanence magnetisation) of the passive magnetic circuit, which effects the total compensation force exerted by the weight force compensation device on the optical element.

According to an embodiment the adjustment element at least partly surrounds the weight force compensation device.

The invention is, however, in no way restricted to a certain geometry of the adjustment element. According to an embodiment, the adjustment element can e.g. have a ring-shaped geometry. The adjustment element can also have, dependent on the specific arrangement used, also any other geometry (which can be rotational symmetric or non-rotational symmetric). In general, all embodiments are comprised by the present invention in which a force generated by the passive magnetic circuit can be continuously manipulated by at least one adjustment element, wherein the adjustment element can be embodied in any suitable component shape, e.g. with a plate-like, axle-like or screw-like shape. Furthermore, the adjustment element can also partly overlap the passive magnetic circuit.

By selecting a specific embodiment of the adjustment element, e.g. with respect to an asymmetric arrangement of the adjustment element, the position and the size and geometric dimensions of the adjustment element, the magnetic properties of the passive magnetic circuit can be systematically affected, e.g. in order to at least partly compensate impacts (e.g. via a magnetic shunt) possible parasitic effects such as e.g. non-desired magnetic circuit effects due to mechanical tolerances and transverse forces as well as mass variations of an optical element the weight force of which is to be compensated and/or non-desired thermal.

Furthermore, a linearization of the so-called adjustment setting curve (describing the dependency of the force exerted by the weight force compensation device on the position of the adjustment element) as well as a reduction of the "stiffness" of the weight force compensation device or a reduced force variance can be achieved by an appropriate design of the (e.g. soft-magnetic) adjustment element.

The adjustment element can (without the disclosure being restricted thereto) e.g. be a component of the weight force compensation device. In further embodiments, the adjustment element can also be integrated into a housing surrounding or encompassing the weight force compensation device. The adjustment element can, in particular, be integrated into a force frame of an EUV-projection objective. Such embodiments are advantageous with respect to an easy accessibility of the adjustment element, e.g. in order to select its position or with respect to heat dissipation.

The adjustment or positioning, respectively, of the adjustment element can be performed manually or in a (preferably self-locking) motorized operation, wherein the position of the adjustment element is selected/adjusted via an appropriate position actuator.

According to an embodiment, the arrangement further comprises a control system, wherein a position of the adjustment element can be controlled by the control system. This can be done e.g. in dependence on at least one operation parameter of the arrangement. This operation parameter can e.g. be the position of the optical element, the force acting on the optical element or the magnetic field strength. Here, a temperature-induced or ageing-induced change of the compensation force exerted by the weight force compensation device on the optical element is reduced compared to an analogous arrangement without the control system.

In accordance with a further aspect present disclosure also relates to an arrangement for mounting an optical element, in particular in an EUV projection exposure apparatus, comprising:
  a weight force compensation device for exerting a compensation force on the optical element, wherein the compensation force at least partly compensates for the weight force acting on the optical element; and
  at least two actuators which each exert a controllable force on the optical element;
  wherein at least one of the actuators generates the controllable force on the optical element in the direction of the compensation force.

This aspect is based on the concept, in particular, in contrast to the construction explained in the introduction, in the direction of the compensation force exerted on the optical element, of additionally also exerting an actively controllable force on the optical element, that is to say in other words of realizing the axis along which the compensation force for the compensation of the weight force acting on the optical element is generated as an actively drivable movement axis of the optical element.

By virtue of the fact that one of the actuators generates the controllable force on the optical element in the direction of the compensation force, firstly it is possible to obtain a significant reduction of the required structural space.

In accordance with the disclosure, the weight force compensation device can, in particular, itself be embodied as an actuator. In this case, therefore, the weight force compensation device is no longer designed only passively for generating a compensation force that is set once and then maintained substantially in constant fashion, but rather realizes a double function insofar as it firstly continues to ensure the weight compensation and secondly is able to generate a controllable (active) force. In this case, in particular, one of the two Lorentz actuators conventionally provided (also designated as "voice coil motor" or "VCM") can be integrated into the weight force compensation device.

In this case, the disclosure is not restricted to the direct integration of a Lorentz actuator into the weight force compensation device. In further embodiments, it is also possible to configure the Lorentz actuator and the weight force compensation device as separate functional units, for instance by virtue of the fact that the Lorentz actuator acting in the direction of the compensation force is arranged separately from or outside the weight force compensation device, but nevertheless generates its drive force in the same force direction in which the compensation force generated by the weight force compensation device also acts.

In accordance with one embodiment, a passive magnetic circuit is provided for generating the force acting oppositely to the weight force. This has the advantage that on the part of the active portion a comparatively low actuation force is required and, consequently, the thermal loads and parasitic effects associated with the force changes generated can be kept small.

In accordance with a further embodiment, it is also possible, whilst completely dispensing with a passive magnetic circuit (such as is contained in the conventional weight force compensation device explained in the introduction), for generating a force acting oppositely to the weight force, to use only a single Lorentz actuator, which is designed to be sufficiently strong and which is able not only to generate a controllable force on the mirror but at the same time to generate the force necessary for compensating for the mirror weight and thus simultaneously performs the function of the weight force compensation device.

In accordance with one embodiment, the actuator acting in the direction of the compensation force, or the weight force compensation device, has at least one coil to which an electric current can be applied and which serves for generating a controllable magnetic force transmitted to the optical element via at least one movable actuator element.

The coils can be arranged, in particular, in the stationary part of the actuator acting in the direction of the compensation force. This firstly has the advantage that thermal loads proceeding from the coils can be dissipated toward the outside in a simple manner, and that it is not necessary to realize any cable feeds to the movable part. However, the disclosure is not restricted thereto. Rather, the coils, in a further embodiment, can also be arranged in the moved part of the actuator acting in the direction of the compensation force. Via such a configuration, the mass present in the moved part can be reduced since the coils are typically lighter than the magnets forming the respective other actuator component.

In accordance with one embodiment, the movable actuator component, i.e. the magnet(s) to which the Lorentz force is applied by the coils of the actuator through which current flows, is provided by magnets already present (anyway) in the passive magnetic circuit. Consequently, no additional permanent magnets over and above the passive magnetic circuit are required for the construction of the actuator, which leads, in particular, to a greater compactness of the system.

In accordance with one embodiment, the optical element is a mirror.

In accordance with one embodiment, a mechanical coupling is formed between at least one of the actuators and the optical element in a manner such that, relative to the drive axis of the actuator, the ratio of the stiffness of the mechanical coupling in an axial direction to the stiffness in a lateral direction is at least 100.

In accordance with one embodiment, for the mechanical coupling, the natural frequency in an axial direction is at least 3 times the bandwidth of the regulation.

In accordance with one embodiment, for the mechanical coupling, the natural frequency in an axial direction is in the range of 600 Hz to 1800 Hz, in particular in the range of 800 Hz to 1400 Hz, more particularly in the range of 1000 Hz to 1200 Hz.

The realization of the above natural frequencies and the low-pass filtering that can be obtained therewith in the case of the mechanical coupling is not restricted to the above-described concept (i.e. the generation of the controllable force by at least one actuator in the direction of a compensation force exerted by a weight force compensation device) or to the presence of a weight force compensation device at all, but rather is also advantageous independently thereof.

In accordance with a further aspect, therefore, the disclosure also relates to an arrangement for mounting an optical element, in particular in an EUV projection exposure apparatus, comprising
- at least two actuators which each exert a controllable force on the optical element;
- wherein a mechanical coupling is formed between at least one of the actuators and the optical element in a manner such that, relative to the drive axis of the actuator, the ratio of the stiffness of the mechanical coupling in an axial direction to the stiffness in a lateral direction is at least 100.

In accordance with a further aspect, the disclosure also relates to an arrangement for mounting an optical element, in particular in an EUV projection exposure apparatus, comprising:
- at least two actuators which each exert a controllable force on the optical element;
- wherein, for the mechanical coupling, the natural frequency in an axial direction is in the range of 600 Hz to 1800 Hz, in particular in the range of 800 Hz to 1400 Hz, more particularly in the range of 1000 Hz to 1200 Hz.

In accordance with one embodiment, the mechanical coupling has a pin provided with two universal joints. In this case, a universal joint should be understood, within the meaning of the present application, to be a joint which has two tilting joints with orthogonal orientation of the tilting axes with respect to one another (or tilting joints connected in series relative to the force flux), which preferably have a common pivot point.

In accordance with one embodiment, the pin has a first partial element, in which one of the two universal joints is formed, and also a second partial element, which is connected to the first partial element in a releasable manner and in which the other of the two universal joints is formed.

In accordance with a further aspect, the invention provides an arrangement for mounting an optical element in an optical system, in particular in an EUV projection exposure apparatus, comprising
- a weight force compensation device for exerting a compensation force on the optical element, wherein the compensation force at least partly compensates for the weight force acting on the optical element;
- wherein the weight force compensation device has at least one magnet which is movable relative to a stationary frame of the optical system and at least one magnet which is stationary relative to the frame; and
- wherein the at least one magnet which is movable relative to the frame is mounted in movable fashion in a direction that deviates from the direction of the compensation force.

In accordance with one embodiment, the weight force compensation device is mechanically coupled to the optical element via a pin.

In accordance with one embodiment, the at least one magnet which is movable relative to the frame is mounted in movable fashion in a direction non-parallel to the longitudinal axis of the pin.

In accordance with one embodiment, a deflection of the pin in a direction that deviates from the direction of the compensation force leads to a relative movement between the magnet which is movable relative to the frame and the magnet which is stationary relative to the frame.

In accordance with one embodiment, the relative movement generates a magnetic moment which at least partly compensates for a transverse force acting on the pin in a direction that deviates from the direction of the compensation force.

In accordance with one embodiment, a mechanical coupling is provided between the frame and the magnet which is movable relative to the frame, the mechanical coupling enabling both an axial displacement of the magnet which is movable relative to the frame in the direction of the weight force and a tilting of the magnet which is movable relative to the frame about a rotational axis perpendicular to the direction of the weight force.

In accordance with one embodiment, the mechanical coupling has an axial guide and a rotary joint.

In accordance with one embodiment, the axial guide is formed by a parallel spring system composed of two leaf springs.

In accordance with one embodiment, the mechanical coupling has a spring element, which enables both an axial displacement of the magnet which is movable relative to the frame in the direction of the weight force and a tilting of the magnet which is movable relative to the frame about at least one rotational axis perpendicular to the direction of the weight force.

In accordance with one embodiment, the mechanical coupling formed by the spring element has a natural frequency in the axial direction in the range of 600 Hz to 1800 Hz, in particular in the range of 800 Hz to 1400 Hz, more particularly in the range of 1000 Hz to 1200 Hz.

In accordance with one embodiment, the pin has two universal joints.

In accordance with one embodiment, the optical element is a mirror.

Further configurations of the invention can be gathered from the description and also the dependent claims.

The invention is explained in greater detail below on the basis of exemplary embodiments illustrated in the accompanying figures.

BRIEF DESCRIPTION OF THE DRAWINGS

In the figures:

FIGS. 11-12a-12b-13a-13b-14 show schematic illustrations for elucidating a further aspect of the present invention.

DETAILED DESCRIPTION OF PREFERRED EMBODIMENTS

Figure 1:
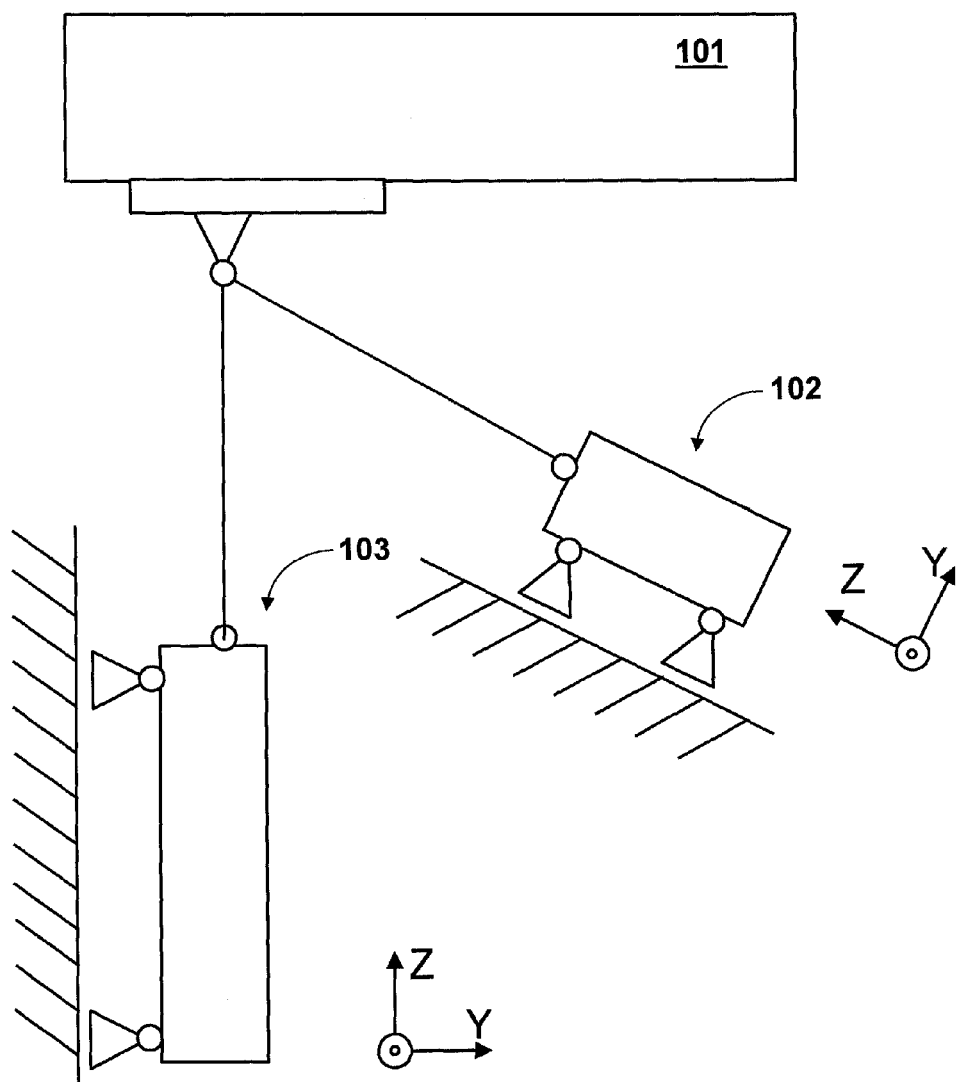
FIG. 1 shows a basic schematic diagram for elucidating the concept underlying the invention.

FIG. 1 firstly shows a basic schematic diagram for elucidating a concept underlying the disclosure.

As is illustrated merely schematically, both a Lorentz actuator 102, which applies an actively controllable force, and a weight force compensation device 103 act on an optical element such as e.g. a mirror 101. In contrast to the construction known from WO 2005/026801 A2, as explained in the introduction, now in the direction of the compensation force exerted on the mirror 101 by the weight force compensation device 103, an actively controllable force is additionally exerted on the mirror 101. This is symbolized in FIG. 1 by a Lorentz actuator (=VCM) additionally being integrated into the weight force compensation device 103. Consequently, the weight force compensation device 103, which will be described in greater detail below, performs a double function insofar as it firstly continues to ensure the weight compensation and secondly is able to generate a controllable (active) force on the mirror 101.

In the context of the present application, the drive direction of an actuator is in each case defined as the z-direction, whereas the x-y plane runs perpendicular to the drive direction. Consequently, in FIG. 1 and also in the further figures, a dedicated coordinate system is in each case assigned to the respective actuators.

Reference is made below to the sectional view from FIG. 2 for more detailed elucidation of one embodiment of the disclosure.

Figure 2:
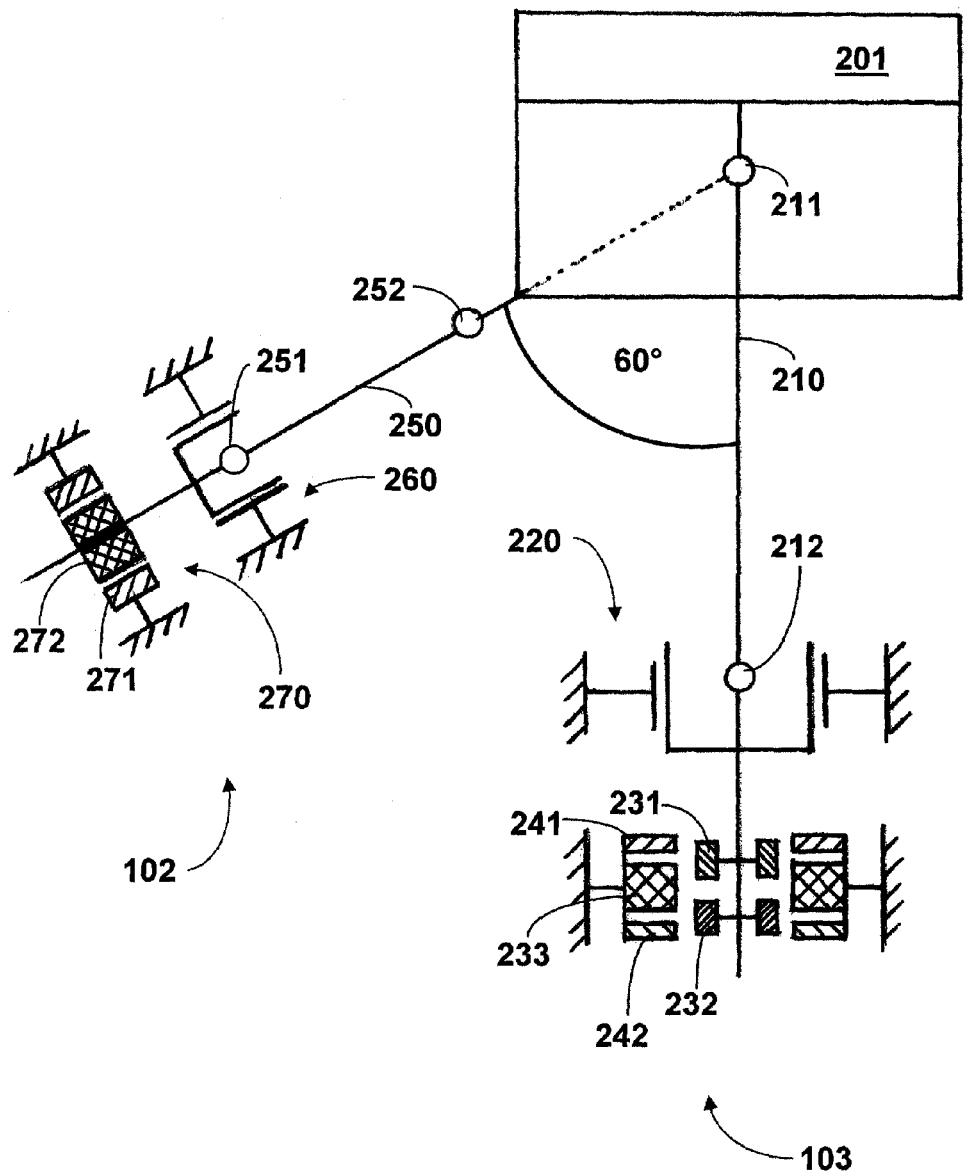
FIGS. 2-3 show schematic illustrations for elucidating one possible embodiment for realizing the concept from FIG. 1.

In this case in accordance with FIG. 2, in particular in a departure from the concept realized e.g. in WO 2005/026801 A2, one of the Lorentz actuators that act in a manner deviating from the weight force direction or are provided in addition to the weight force compensation device is dispensed with by virtue of the weight force compensation device 103 itself being embodied as an actuator. Consequently, only one lateral Lorentz actuator 102 remains, which in the exemplary embodiment (without the disclosure being restricted thereto) is arranged at an angle of 60° with respect to the vertical. In accordance with this exemplary embodiment, therefore, the weight force compensation device 103 (which conventionally acts only passively) is extended to the effect that an active manipulated variable can be applied, such that now, therefore, a combined movement axis that acts actively and also passively at the same time exists, which is advantageous firstly for reasons of structural space, in particular.

The weight force compensation device 103 from FIG. 2 is therefore no longer designed only passively, but rather performs a double function by virtue of the fact that it firstly continues to ensure the weight compensation and secondly one of the two Lorentz actuators conventionally provided is integrated into the weight force compensation device, such that the weight force compensation device is simultaneously able to generate a controllable (active) force.

"220" schematically indicates a linear guide (or axial guide) which, in the exemplary embodiment, is configured as a parallel spring system composed of specifically designed leaf springs (which will be explained in even greater detail further below with reference to FIGS. 5a, 5b and 6a, 6b), which substantially have the function of obtaining a linear guide which is free with regard to displacement in the z-direction and rotation about the z-axis.

Furthermore, in accordance with FIG. 2, a pin 210 extending in the vertical direction or running axially relative to the drive direction or z-direction is present, which transmits the movement in the vertical direction to the mirror 101 and has two universal joints 211, 212 or cardan joints, such that the pin 210 transmits a force or movement only in the axial direction, whereas substantial decoupling is present in all the other directions, as will be explained in even greater detail below.

Figure 8:
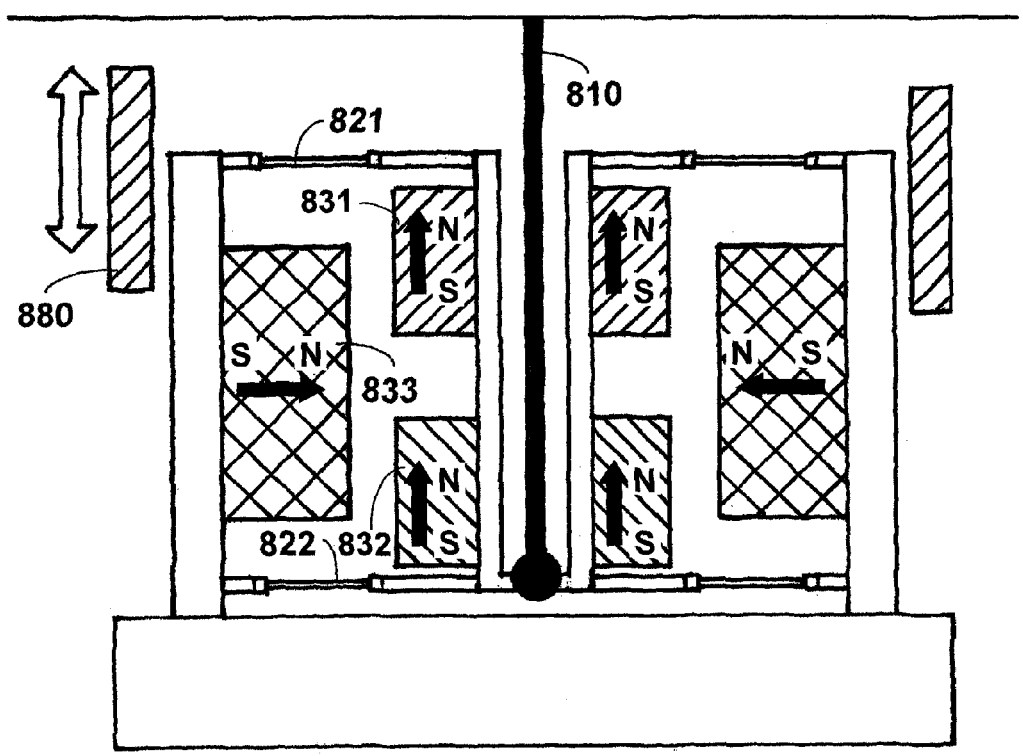
FIG. 8 shows a schematic illustration for elucidating a further possible embodiment of the construction from FIG. 2 using an adjustment ring.

The magnetic circuit itself comprises, as illustrated in even greater detail with reference to FIG. 8, firstly conventionally a passive magnetic circuit composed of an outer magnetic ring 233, which, in the exemplary embodiment illustrated, is polarized radially relative to the z-axis running in the drive direction, and also two magnetic rings 231, 232 arranged radially further inward, which, in the exemplary embodiment illustrated, are in each case polarized axially relative to the z-axis, wherein both the outer magnetic ring 233 and the magnetic rings 231, 232 arranged in an inner position are in each case embodied as permanent magnets. This inner assembly is guided via the linear guide formed by the parallel spring system 220 composed of leaf springs.

The disclosure is not restricted to the illustrated magnetization directions and embodiments of the magnetic rings, which can be realized in many other variants (e.g. as described in WO 2009/093907 A1).

The passive magnetic circuit generates, in a manner known per se, a force which acts in a vertical direction and which is intended to compensate for the weight force. The two magnetic rings 231, 232 arranged radially in an inner position are displaceable in the vertical direction (i.e. vertically displaceable), as a result of which they can be positioned variably both with respect to one another and relative to the radially outer magnet 233, wherein the force that can ultimately be transmitted via the passive magnetic circuit formed by the magnetic rings 231-233 can be set by varying these positions of the magnetic rings 231, 232. More precisely, variation of the axial spacing of the inner magnetic rings 231, 232 primarily determines the magnitude of the force which is exerted by the magnetic field on the movable inner assembly with the moved mass carrying the mirror 201, and the displacement of the inner magnetic rings 231, 232 with respect to the outer magnetic ring 233 primarily determines the position of the force maximum of the actuator characteristic curve relative to the mechanical position of the carrier frame.

Via the axial distance between the radially inner magnetic rings 231, 232, therefore, a fixed force value can be set via the passive magnetic circuit, wherein the setting and designing of the weight force compensation system are optimally effected in terms of the design such that no or only a minimal force change (dominated by the design of the magnetic circuit) occurs via the movement typically performed by the mirror 201.

In contrast to the conventional construction realized in WO 2005/026801 A2, for example, two coils 241, 242 are now provided in the exemplary embodiment, wherein, via applying an electric current to the coils 241, 242 according to the principle of the Lorentz actuator, a controllable force acting in the vertical direction can be exerted on the moved inner part. Even though the exemplary embodiment shows two coils, in further embodiments in this respect it is also possible to provide more or fewer coils, i.e. in particular also only a single coil.

The coils 241, 242 act on the two axially polarized magnetic rings 231, 232 which are arranged radially in an inner position and are movable in the vertical direction via the linear guide formed by the leaf springs. In other words, by applying an electric current to the coils 241, 242, a Lorentz force is generated and an increase or decrease in the generated force is thus achieved. While solely the arrangement composed of radially inner magnets 231, 232 forms a passive magnetic circuit, the additional arrangement of the coils 241, 242 turns the entire arrangement composed of the coils 241, 242, the radially inner magnets 231, 232 and the radially outer magnet 233 into an actively controllable magnetic circuit via which an actively controllable force can be transmitted to the mirror 101.

Even though, in the exemplary embodiment from FIG. 2, the coils 241, 242 to which an electric current can be applied or the actuator formed by the coils is integrated into the weight force compensation device, the disclosure is not restricted thereto. Rather, in further embodiments, it is also possible to provide the Lorentz actuator and the weight force compensation device as separate functional units, for instance by virtue of the Lorentz actuator or voice coil drive together with its functional units of coil and passive magnets being arranged outside (e.g. in FIG. 2 below) the weight force compensation device.

Figure 3:
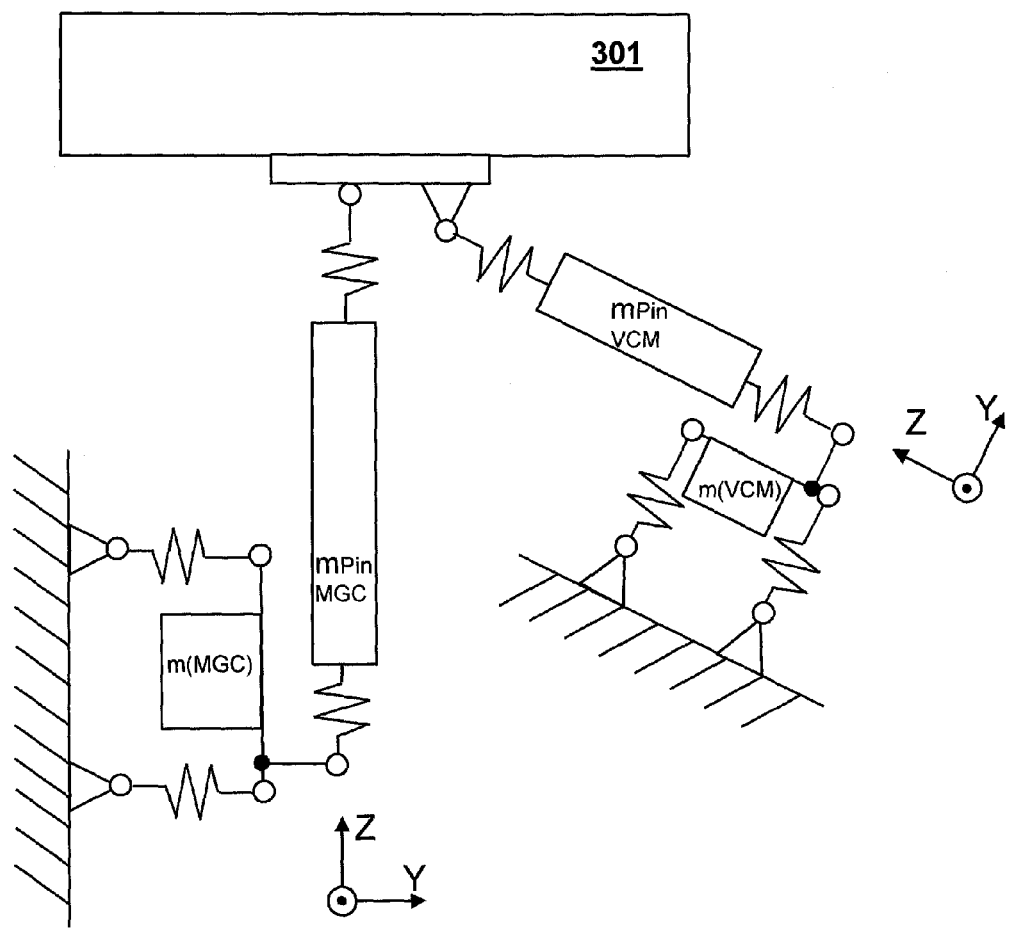

FIG. 3 shows a schematic illustration for elucidating a dynamic model underlying the arrangement from FIG. 2, wherein, in particular, the universal joints 211, 212 and 251, 252 of the pins 201 and respectively 250, on the one hand, and the parallel spring systems 220 and respectively 260, on the other hand, are represented by spring symbols with associated joint points (symbolized by the open circles).

As far as in this illustration firstly the Lorentz actuator (=VCM) 102 is concerned, this Lorentz actuator not acting in the weight force direction, in accordance with the right-hand part of FIG. 3 $MPin_{VCM}$ designates the mass of the pin 210, which couples the mirror 201 to the permanent magnet 272 of the Lorentz actuator 102 via the spring connections formed by the universal joints 211, 212 (the fixed linking being symbolized by the closed circle). For its part, the moved mass m(VCM) of the permanent magnet is coupled via the parallel spring system 260, which is symbolized by springs with associated joint points, to the coil 271 of the Lorentz actuator 102, the coil being connected to the stationary surroundings.

Analogously, as far as the weight force compensation device 103 is concerned, $MPin_{MGC}$ designates the mass of the pin 250, which, via the spring connections formed by the universal joints 251, 252, couples the mirror 201 to the moved mass—designated by m(MGC)—of the weight force compensation device 103 (in particular the magnetic rings 231, 232 arranged radially in an inner position from FIG. 2). For its part, the moved mass of the weight force compensation device 103 is coupled via the parallel spring system 220, which is likewise symbolized by springs with associated joint points, to the components of the weight force compensation device 103 (in particular coils 241, 242 and radially outer magnetic ring 233) which are connected to the stationary surroundings.

Figure 4:
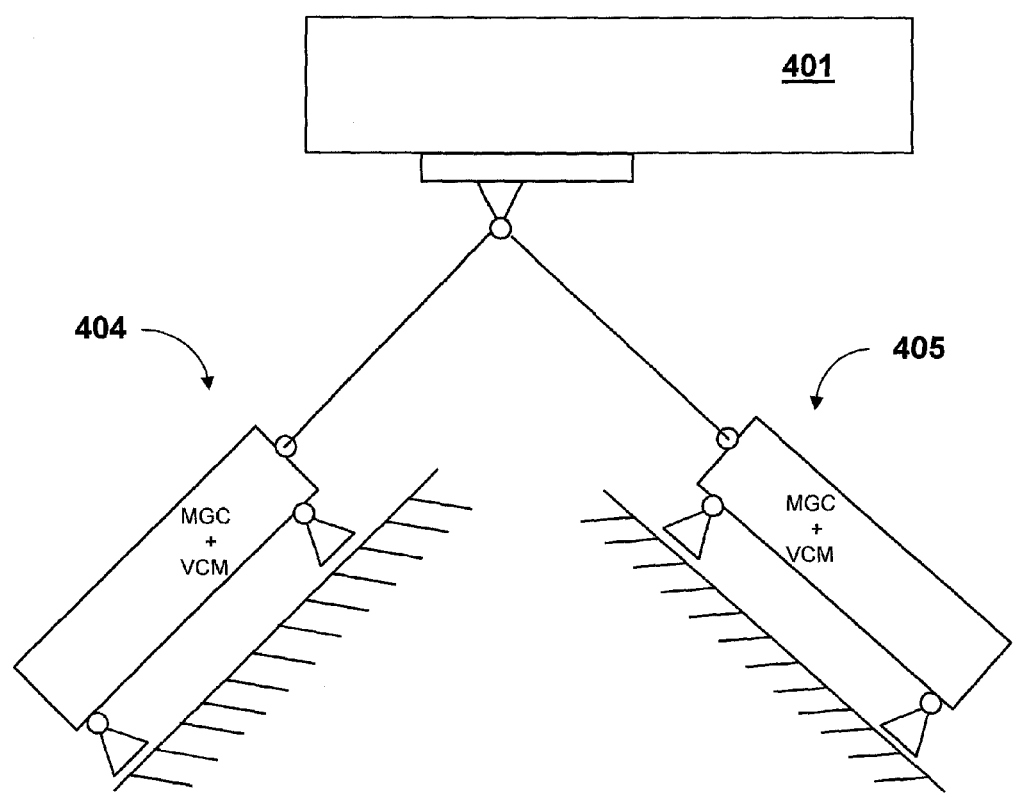
FIG. 4 shows a basic schematic diagram for elucidating a further embodiment of the invention.

In a further exemplary embodiment illustrated schematically in FIG. 4, it is also possible to provide two drives 404, 405 each firstly acting passively in the manner of the conventional weight force compensation device and to supplement them in each case by an active component (i.e. in the manner of the coils 241, 242 from FIG. 2). Consequently, the two passive-active drives 404 and 405 from FIG. 4 have in each case both coils to which electric current can be applied and a permanent magnetic circuit which inherently acts passively. These two drives 404 and 405 are arranged (e.g. at in each case 45° with respect to the vertical) precisely in such a way that in the "original state" in total the force effect of the passive magnetic circuits arises for weight force compensation in the vertical direction and (virtually) no horizontal force effect remains.

In yet another exemplary embodiment, the weight force compensation device from FIG. 2 can also be designed such that, while dispensing with a passively acting drive, it comprises only an active system. In this example, therefore, the overall system has two Lorentz actuators or active drives, one of which acts along the vertical and thus simultaneously performs the function of the weight force compensation device.

The construction of the Lorentz actuator 102 (i.e. of the Lorentz actuator not integrated into the weight force compensation device) in accordance with one embodiment is explained in greater detail below.

The construction of the Lorentz actuator 102 from FIG. 2 includes a further departure from the conventional concept (realized e.g. in WO 2005/026801 A2) of fitting the Lorentz actuators by their respective passive part (i.e. the movable permanent magnet) fixedly in the sense of a rigid-body connection to the mirror.

In the concept described here, as explained in further detail below, via a pin 250 that is designed in a suitable manner and brings about a partial "decoupling" explained below, there is a mechanical connection to the movable part or permanent magnet of the Lorentz actuator, which in turn, for its part, is guided linearly.

More precisely, in the construction from FIG. 2—in contrast to the conventional construction—a specific pin 250 with cardan joints and leaf springs are additionally provided, the configuration of which is explained in greater detail below. In the exemplary embodiment, the pin 250 in the same way as the remaining parts with the exception of the radially inner or the radially outer magnetic rings is produced from a material that is non-magnetic in order to avoid an undesirable influencing of the magnetic fields generated, wherein in particular titanium is suitable for the pin 250 and e.g. high-grade steel is also suitable for the remaining (carrier) parts.

In further embodiments, it is also possible to use additional "return path elements" composed of magnetically highly permeable material for flux guidance and reduction of losses and leakage fields.

The pin 250 has for the purposes of decoupling in the lateral direction (i.e. perpendicularly to the drive axis) in its respective end sections two universal joints or cardan joints 251, 252, with the result that it has a high degree of stiffness only in the axial direction for transmitting a force or movement, whereas only a low degree of stiffness (i.e. a decoupling) is present in all other directions.

The departure from the conventional concept of a rigid-body connection between permanent magnet of the Lorentz actuator, on the one hand, and mirror, on the other hand, takes account of the fact that the rigid-body connection, on account of the significant mass coupling, can result in a reduction of the natural frequency of the overall system and a generation of dynamic modes that are undesirable or controllable only with difficulty. That is based on the consideration that every mirror present in the system has, as an oscillatory body, fundamental eigenmodes or intrinsic stiffnesses which, depending on the masses coupled to the mirror, are influenced undesirably to the effect that they firstly decrease in relation to low frequency values (i.e. eigenmodes other than the fundamental eigenmodes of the mirror are generated) and secondly assume high amplitudes. With regard to the fact that the accuracies of the positionings of the mirror surfaces that are to be performed typically lie in the picometers range, the changes concerned in the eigenmodes or intrinsic stiffnesses can become so relevant that they can no longer be combated by control engineering. If, by way of example, a typically required control bandwidth (determined by the natural frequencies of controlled system and controller) of at least 100 Hz is taken as a basis, within which the system has to be controllable or able to be supervised, then the above-described decrease in the natural frequencies can have the effect that, owing to the decrease in the natural frequencies of the controlled system, the system can no longer be brought to the desired control bandwidth by the controller.

In order to take account of that, in the form of the pin provided with universal joints, mechanical elements are used for linking the Lorentz actuators to the mirrors, by which the sum of the mechanical elements has a comparatively high natural frequency in the drive direction, on the one hand, but has suitable compliances in the other degrees of freedom. In other words, the stiffness set for the pin 250 in the axial (drive) direction or z-direction is comparatively high, whereas the pin 250 has extremely soft behavior in the other directions since the universal joints 251, 252 have only very low stiffness transversely with respect to the drive direction or z-direction.

In other words, the coupling of the passive or movable part of the Lorentz actuator 102 to the mirror 201 is realized as a mass-spring oscillator which can be determined well or can be designed in a defined manner in terms of its dynamic properties or its stiffness and the natural frequency f of which is linked to the stiffness k (in units of N/m) via the relationship:

$$f = \frac{1}{2 \cdot \pi} \sqrt{\frac{k}{m}} \qquad (1)$$

where m denotes the mass coupled via the spring.

Generally, the natural frequency should be at least three times the required bandwidth of the control.

In the specific exemplary embodiment, the natural frequency is 1200 Hz in the z-direction. In this case, excitations whose frequency exceeds 1200 Hz are coupled into the mirror 201 only with great attenuation, since the system composed of moved mass formed by the permanent magnet 272 and spring realized by the pin 250 brings about a corresponding low-pass filtering. The natural frequencies should in each case be chosen suitably in a manner dependent on the specific controller concept. Preferably, the natural frequency in the axial direction is in the range of at least 600 Hz, in particular at least 800 Hz, and below approximately 1800 Hz, in particular in the range of 800 Hz to 1400 Hz, more particularly in the range of approximately 1000 Hz to 1200 Hz. Furthermore, the ratio of the natural frequencies in the lateral direction and axial direction is preferably at least 1:100. Correspondingly, on account of the relationship from equation (1), therefore, the ratio of the stiffnesses in the lateral direction and axial direction is at least 1:10000.

The mechanical connection—furthermore required for force transmission—of the Lorentz actuator 102 or of the moved part thereof to the mirror 101 is thus designed specifically with respect to a natural frequency of the coupled system. While in the case of the conventional rigid linking to the mirror, as explained above, the masses concomitantly moving together with the mirror cannot oscillate independently, in the present disclosure the moved mass (i.e. the permanent magnet 272) of the Lorentz actuator 102 is dynamically linked to the mirror 201 via the pin 250, with the result that the natural frequency in the axial (drive) direction is determined by the coupled mass and the specifically designed stiffnesses of the pin 250.

The stiffnesses present in the lateral directions are preferably not realized solely via the singular system of the spring-mass oscillator that produces the coupling of the passive or movable part of the Lorentz actuator 102 to the mirror 201, but rather via additional spring elements provided for lateral support. These spring elements are designed such that the movable part of the Lorentz actuator 102 (i.e. the permanent magnet 272) substantially only performs a linear movement relative to the stationary coil 271, that is to say that the pin 250 is guided only along one axis with low stiffness, a correspondingly high stiffness being present in all other directions. As will be explained below with reference to FIGS. 5a-b and 6a-b, in embodiments of the disclosure a parallel spring system 260 composed of specifically designed leaf springs which bring about an additional torsional decoupling is used for this purpose. The leaf springs—oppositely to the pin 250—are relatively soft in the axial direction and significantly influence the stiffness only in the lateral direction.

In the context of the disclosure, therefore, the movable part or permanent magnet 272 of the Lorentz actuator 102 is mechanically coupled to the stationary part of the Lorentz actuator 102, the stationary part having the coil 271 through which current flows. On account of this cancellation of the above-described conventional decoupling between movable permanent magnet 272 and stationary coil 271, it is furthermore of particular importance, via corresponding embodiment of the parallel guide of the movable part or permanent magnet, for possible parasitic forces or parasitic moments which are transmitted to the mirror 101 via the mechanical coupling or spring joints to be kept in a range that can still be afforded tolerance, which is effected via the parallel spring system comprising leaf springs that will be explained below.

Overall, therefore, in the construction from FIG. 2, the Lorentz actuator 102 is mechanically coupled to the overall system in all six degrees of freedom with a specifically adjustable stiffness, wherein this coupling is effected with the passive part (moved mass or permanent magnet 272) of the Lorentz actuator 102 via the spring effect of the pin 250 to the mirror 201 and simultaneously to the rest of the surroundings via the parallel spring system 260.

Embodiments of the parallel spring system 260 composed of leaf springs, as already mentioned, will be explained below with reference to FIGS. 5a-5b and 6a-6b. This parallel spring system 260 is used since, via the design of the pin 250, although it is possible to set the desired natural frequency for the degree of freedom of the displacement in the z-direction (i.e. in the axial direction along the drive axis) (e.g. to the abovementioned exemplary value of 1200 Hz), the pin 250 alone does not yet produce natural frequencies that can be determined far enough or in a targeted manner in the lateral direction (i.e. in the x-y plane perpendicular to the drive axis). In particular, for instance the stiffness with respect to the degree of freedom of the rotation about the z-axis (i.e. $R_z$) substantially arises as a parasitic, non-controllable disturbance variable from the set natural frequency with respect to the degree of freedom of the displacement in the z-direction.

The function of the parallel spring system 260 or of the leaf spring elements described below is firstly a guide in the desired operative or drive direction (i.e. in the z-direction) and secondly a support in the lateral direction (i.e. in the x-y plane).

The configuration of the leaf spring 500 already mentioned above in accordance with one embodiment is explained below with reference to FIGS. 5a and 5b. In this case, use is made of a construction composed of two leaf springs 500, which are arranged in a manner connected in series along the operative direction of the Lorentz actuator 102 and jointly permit substantially only a linear movement in the drive direction or z-direction.

The movable pin 210 coupled to the mirror 101 is fixedly connected to the radially inner section of the leaf spring 500, whereas the stationary surroundings are fixedly connected to the radially outer section of the leaf spring 500. In accordance with FIGS. 5a and 5b, the leaf spring 500 has three bending beams 510, 520 and 530 arranged tangentially. FIGS. 6a and 6b shows one advantageous further development of a leaf spring 600, likewise having three bending beams 610, 620 and 630 arranged tangentially.

The tangential arrangement of the bending beams 610, 620 and 630 brings about, in the case of an axial deflection, in addition to the desired z-displacement, a parasitic rotary movement which results from the deflections of the three bending beams 610, 620 and 630 and, given identically oriented installation of the leaf springs 600, leads to a strain of the pin 210 and a force on the mirror 101. Given torsionally stiff arrangement of the leaf spring 600, a rotary movement leads to an additional strain of the bending beams 610, 620 and 630 and thus to a great increase in the axial stiffnesses. If two leaf springs 600 that are installed in opposite directions or act against one another are used, the leaf springs 600 are tensioned against one another, which, upon deflection of the leaf springs 600, results in an increase in the spring force such that the leaf springs 600 exhibit stiffer behavior with increasing deflection.

Figure 5A:
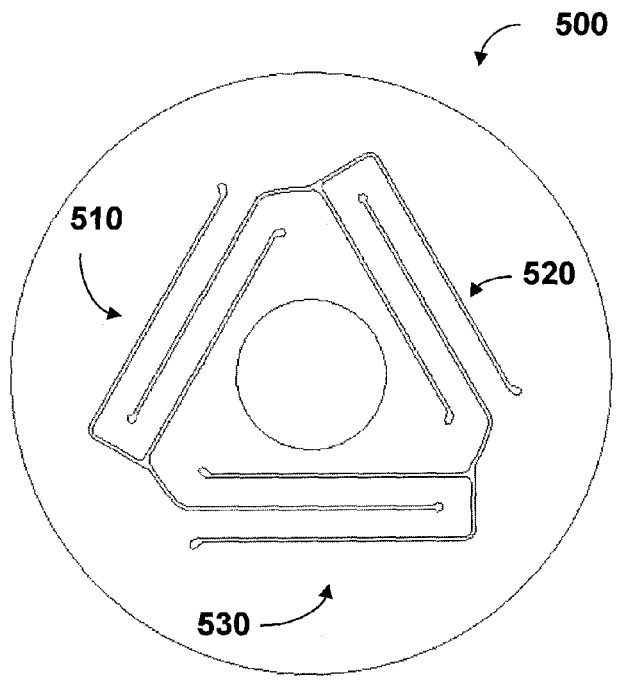
FIGS. 5a-6b show schematic illustrations of possible embodiments of leaf springs used in the construction from FIG. 2.
Figure 5B:
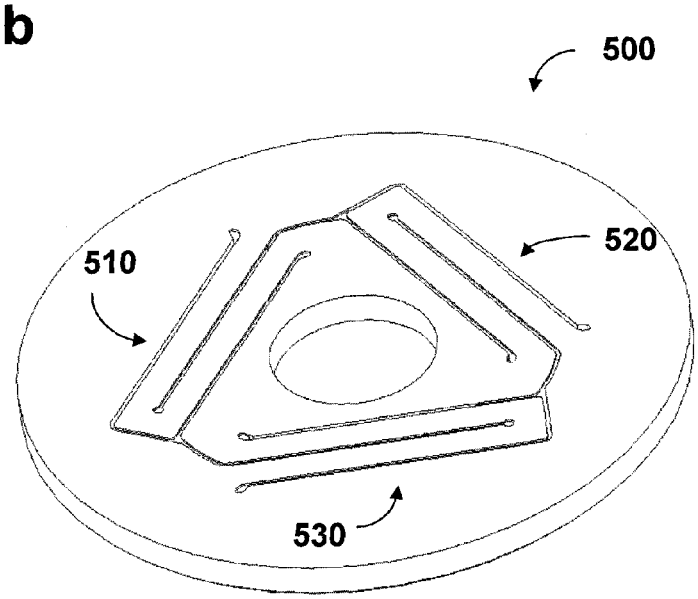
Figure 6A:
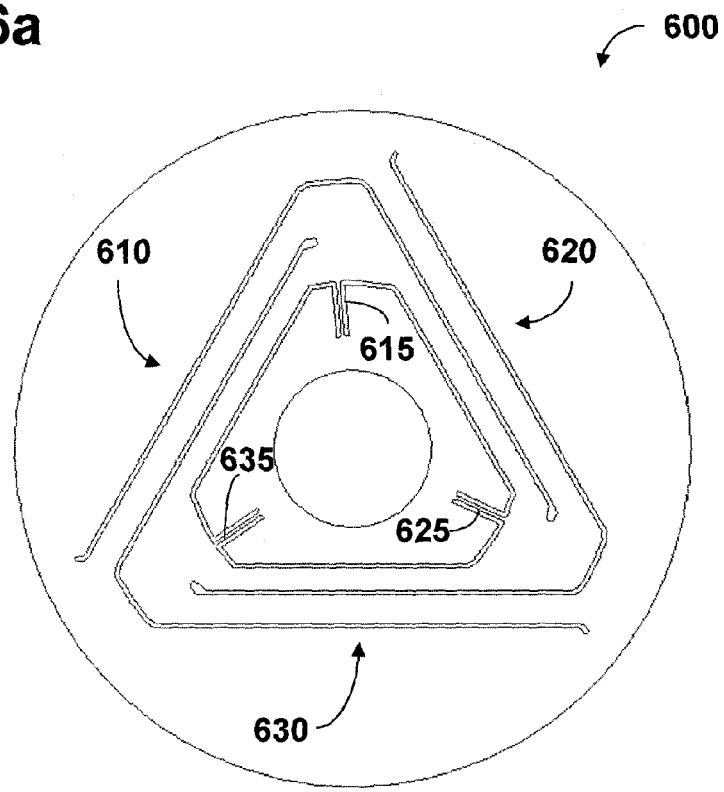
Figure 6B:
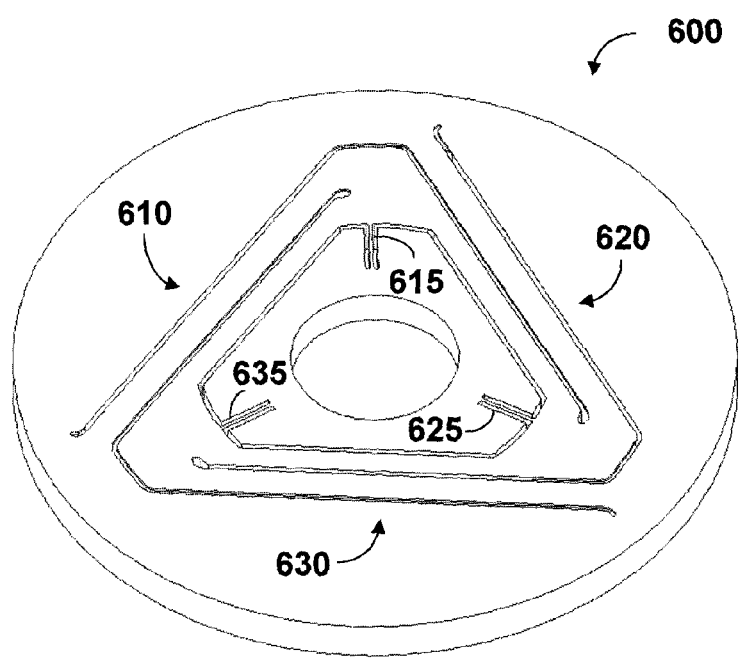

The above-described effect of the parasitic rotary movement can be wholly or partly reduced in the embodiment from FIGS. 5a and 5b by the double or bent guidance of the individual bending beams 510, 520 and 530 running back and forth. In the exemplary embodiment from FIGS. 6a and 6b, by contrast, three leaf spring decoupling joints extending radially outward are additionally present. Each of the leaf spring decoupling joints has in each case a bending beam 615, 625 and 635, respectively, which runs in the radial direction and which forms in each case a decoupling web for connection between the radially inner section and the radially outer section, with the result that the radially inner section of the leaf spring 600 can be rotated relative to the radially outer section of the leaf spring 600. The decoupling joints which bring about the torsional decoupling can be arranged radially on the inner side or else radially on the outer side with respect to the bending beams.

The decoupling joints described above can bring about an additional torsional decoupling with respect to the above-described rotary movement induced by an axial deflection. The bending beams 615, 625 and 635 running in the radial direction are embodied only with a relatively small thickness in the tangential direction or in the x-y plane and are therefore relatively soft (that is to say have a good compliance with respect to rotation about the z-direction, i.e. with respect to the degree of freedom $R_z$), but in the z-direction are relatively thick (e.g. of the order of magnitude of 0.3-2.5 mm) and thus relatively stiff. As a result, what is also achieved thereby is that the leaf spring 600 becomes less sensitive to introduced torsional stresses during assembly, horizontal stiffnesses being impaired only minimally.

In other words, the respective stiffnesses (in units of N/m) should be constituted such that the aspect ratio between the lateral stiffness (i.e. the stiffnesses with respect to displacements in the x-y plane, which correspond on account of the rotational symmetry) and the axial stiffness (i.e. the stiffness for displacement in the direction of the z-axis) is as high as possible. In the ideal case, the leaf springs would result in a complete fixing in the x-y plane and a linear guide (without any stiffness) in the z-direction, i.e. the desired operative direction. Quantitatively, the ratio between lateral stiffnesses and axial stiffness is at least 3000, in particular at least 6000, more particularly at least 9000.

Figure 7:
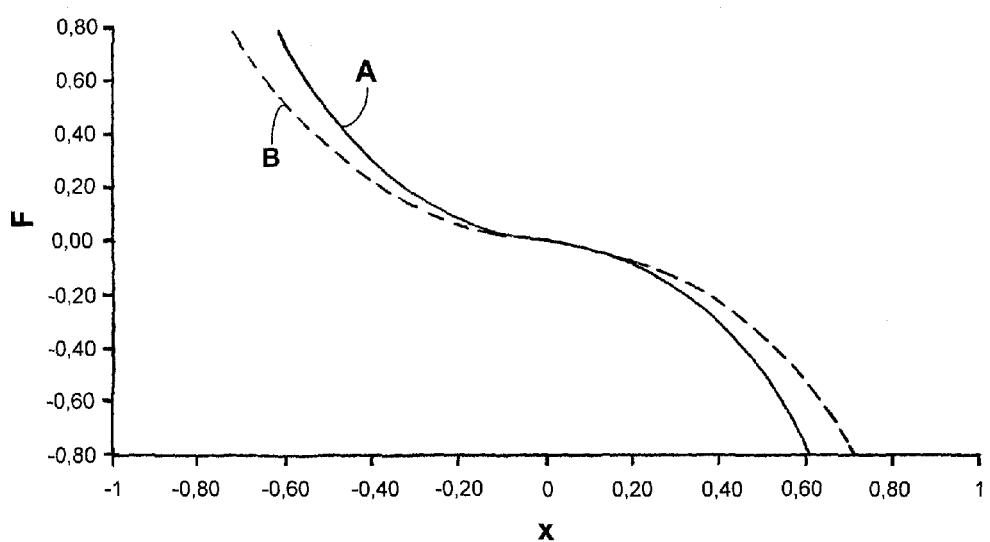
FIG. 7 shows a diagram elucidating, on the basis of force-distance characteristic curves, the method of operation of the leaf springs shown in FIGS. 5a, 5b and 6a, 6b.

Furthermore, preferably, on account of the leaf spring decoupling joints described above, the maximum actuating force occurring over the entire travel of the leaf springs 600 is smaller by a factor of two than in an analogous construction without the additional radial decoupling elements or webs: on account of the configuration of the leaf springs, the force/distance characteristic curve illustrated in the diagram in FIG. 7 now acquires a flatter profile. What is sought is a spring stiffness that is as constant as possible (corresponding to a constant gradient of the force-distance characteristic curve over the entire travel x), wherein, moreover, the gradient or the spring stiffness should have a value that is as low as possible. In FIG. 7, curve "A" shows an exemplary characteristic obtained for two leaf springs installed in opposite directions without the torsional decoupling described with reference to FIGS. 6a and 6b, and curve "B" shows the corresponding characteristic with the torsional decoupling described with reference to FIGS. 6a and 6b. The improvement obtained with curve "B" is manifested primarily in the case of higher deflections (i.e. larger travel).

Even though, in the exemplary embodiment from FIG. 2, the leaf springs described with reference to FIGS. 6a and 6b are used only in the weight force compensation device 103, they can, in principle, also be provided in the region of the Lorentz actuator 102 that does not act in the z-direction.

As already described on the basis of the construction in FIG. 2, in principle the setting of the passive force component in the vertical direction can be effected by varying the position of the radially inner magnets 231, 232 relative to one another and/or relative to the outer magnet 233.

According to FIG. 8 an additional adjustment element 880 (which is, in the embodiment of FIG. 8, an adjustment ring) is used in order to continuously adjust the total compensation force exerted by the weight force compensation device 103 via a continuous manipulation of the force component generated by the passive magnetic circuit. In the embodiment (but without the invention being restricted thereto) the adjustment element 880 has a ring-shaped geometry and is made of a soft-magnetic material. Via a displacement of the adjustment element 880 in the vertical direction (i.e. in an axial direction relative to the direction of the compensation force exerted by the weight force compensation device) the magnetic field lines generated by the passive magnetic circuit (formed by the radially inner magnetic rings 831, 832 and the radially outer magnetic ring 833), and thereby the force which is finally exerted on the optical element or the mirror, respectively, can be continuously and reversibly manipulated.

The arrangement of this adjustment ring 880 has the advantage that, on account of the fact that even a displacement of this ring over a relatively large distance brings about only a relatively small change (typically by a few percent, e.g. 1-2%) in the force generated by the passive magnetic circuit, it is possible to perform a fine adjustment which, firstly, is more difficult to realize via the passive magnetic circuit itself and, secondly, also does not require direct access to the passive magnetic circuit itself.

During operation, therefore, firstly (for a preliminary or coarse adjustment) the magnetic field is preset via the distance setting of the inner magnetic rings 831, 832 and is subsequently varied via the adjustment ring 880 still in a small setting range (of a few percent), by virtue of the adjustment ring 880 exerting, depending on the specific requirements, an attenuating or amplifying effect on the magnetic field and hence on the force transmitted to the mirror 101. The adjustment via the outer adjustment ring 880 has the further advantage that a heat input into the system which would accompany a fine setting—likewise possible in principle—via the coils (not illustrated in FIG. 8) as active part of the device can be avoided in this respect.

In further embodiments, it is also possible to use two adjustment elements or adjustment rings, respectively, which can be arranged, in particular, symmetrically with respect to the central plane of the outer magnetic ring. Furthermore, in even further embodiments, it is also possible to use more than two adjustment elements or adjustment rings, respectively, which can be arranged in serious with one another.

Figure 9:
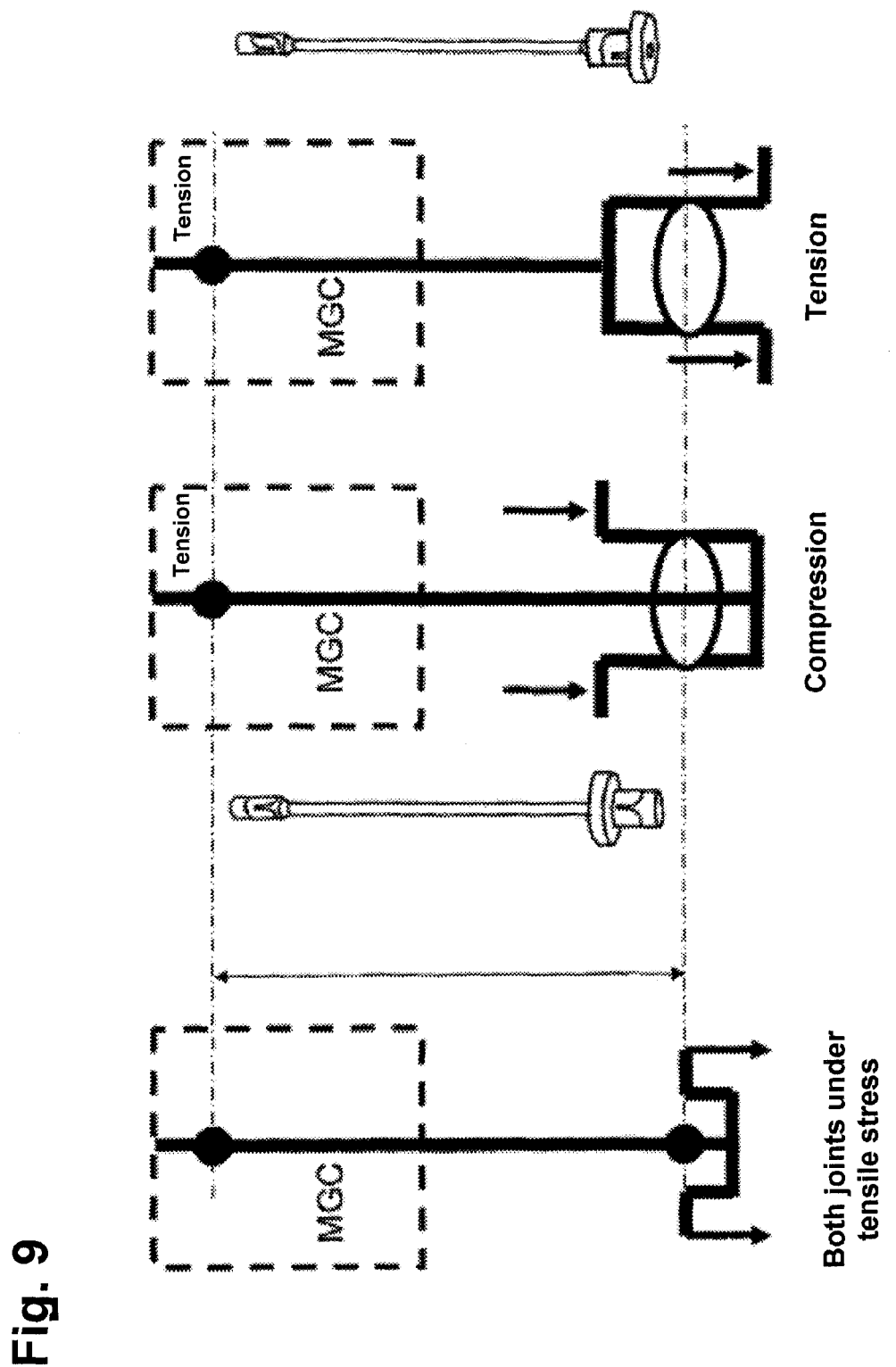
FIGS. 9-10 show schematic illustrations for elucidating the method of operation of a hollow joint used in one embodiment of the invention in the construction from FIG. 2.
Figure 10:
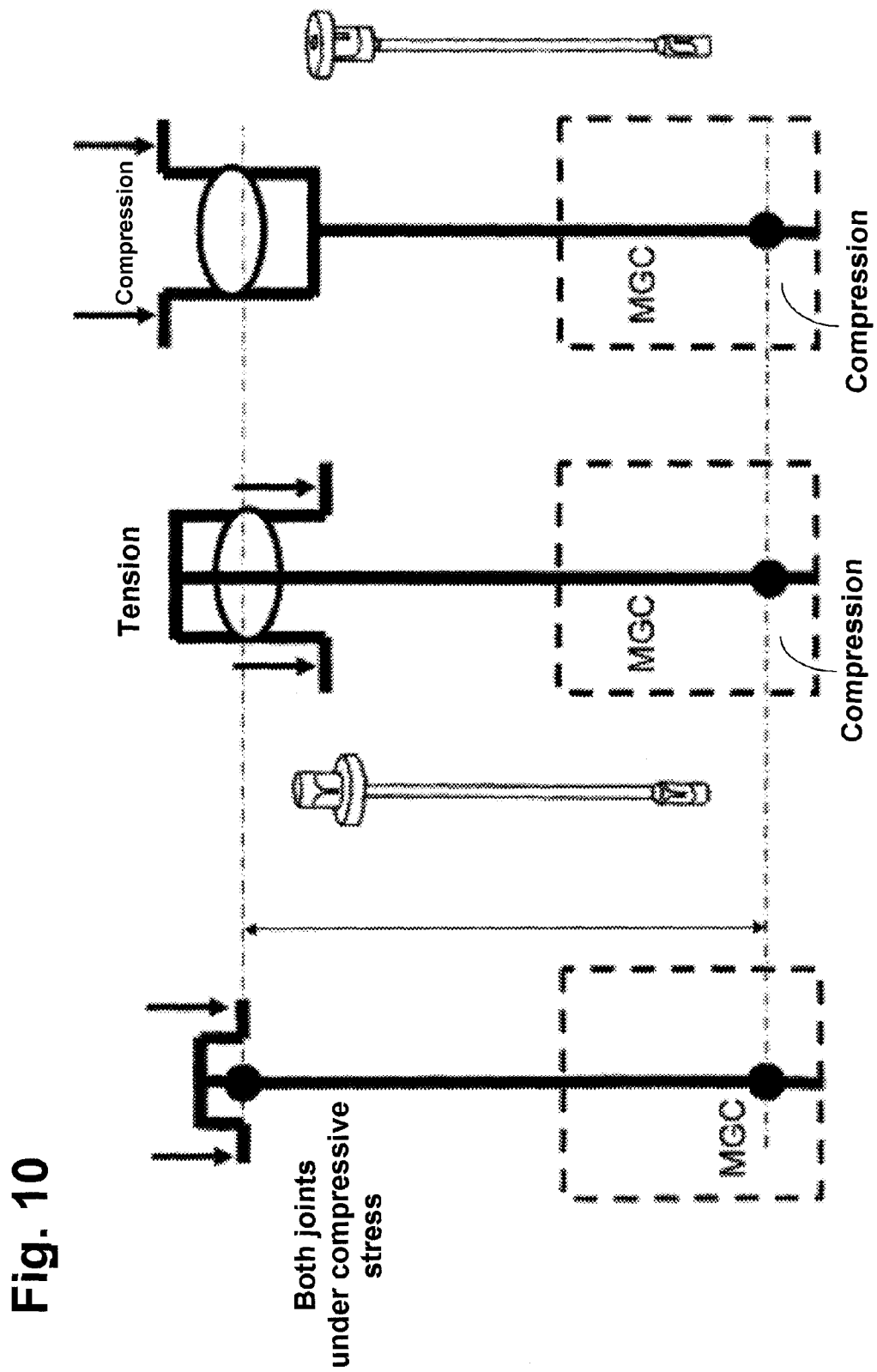

The construction of the bush joint already mentioned in accordance with one preferred embodiment is explained below with reference to FIGS. 9 and 10. The pin 210 firstly has, in a manner known to this extent, two cardan joints 211, 212, by which a decoupling in the directions not extending axially is obtained.

Furthermore the pin 210 is configured in a particular manner such that it has a first partial section, in which one of the two universal joints 211 is arranged, and also a second partial section, which is separate from the first partial section or arranged via a mechanical interface and in which the other of the two universal joints 212 is arranged (instead of the pin 210 being embodied integrally or monolithically). Furthermore, in one preferred configuration, one of the cardan joints 212 is embodied as hollow on the inside, such that the pin 250 can be led through this cardan joint 252 and a freely selectable force flux can thus be generated.

As far as the first-mentioned subdivision of the pin 210 into two sections is initially concerned, by virtue of the fact that one of the universal joints 211, 212 is arranged in a decoupled section which is separate from the remaining part of the pin 210 and which is fixedly fitted to the mirror, a reduction of deformation on the part of the mirror 101 is obtained. This takes account of the circumstance that the mirror 101 is sensitive to any introduction of force on account of the accompanying surface deformations. This configuration is based on the consideration that, with repeated use of the mirror 101 in measuring and manufacturing apparatuses, a mounting of the mirror 101 that is identical in all steps can be realized insofar as the force introduction point at the mirror 101 can be kept unchanged. In other words, what can be achieved via the above-described division of the pin 210 into two is that the joint position of one of the two universal joints 211, 212 remains fixed with respect to the mirror 101, since this universal joint 211 is fixedly connected to the mirror 101. The corresponding universal joint 211 fixedly connected to the mirror 101 is designated hereinafter as bush joint.

The hollow configuration of the bush joint takes account of the circumstance that, depending on the specific conditions of use in the optical system, a mirror can be arranged in a manner suspended from the respective actuator or else in a manner standing on the respective actuator.

By virtue of the fact that the bush joint is embodied in hollow fashion, via the linking point to the mirror it is possible to choose freely whether the respective joint is subjected to tensile or compressive loading, to be precise independently of how the mirror 101 is arranged in the optical system. What is decisive for this is the combination of the force direction, on the one hand, and the location of the fixed linking of the joint, on the other hand, which in turn is freely selectable on account of the hollow configuration. Specifically, it is necessary to orient the force direction via the joint toward the linking location in order that compressive loading is effected. Conversely, the force direction as viewed via the joint has to point away from the linking location in order that tensile loading is effected. Therefore, once the system has been optimized with regard to the stiffnesses and the dynamic properties, these settings can be realized or maintained both for mirror arrangements that are suspended in the above sense and for standing mirror arrangements.

In the embodiments described above, in each case a pin with two universal joints is used, which transmits the movement in the vertical direction to the mirror 101 by virtue of the fact that, via the spring connections formed by the universal joints, it couples the mirror 101 to the moved mass of the weight force compensation device 103 and, in particular, the associated magnetic rings 231, 232 arranged radially on the inside from FIG. 2. In this case, as already explained, a universal joint within the meaning of the present application is understood to be a joint which has two tilting joints with orthogonal orientation of the tilting axes with respect to one another (or tilting joints connected in series relative to the force flux), which preferably have a common pivot point.

Figure 11:
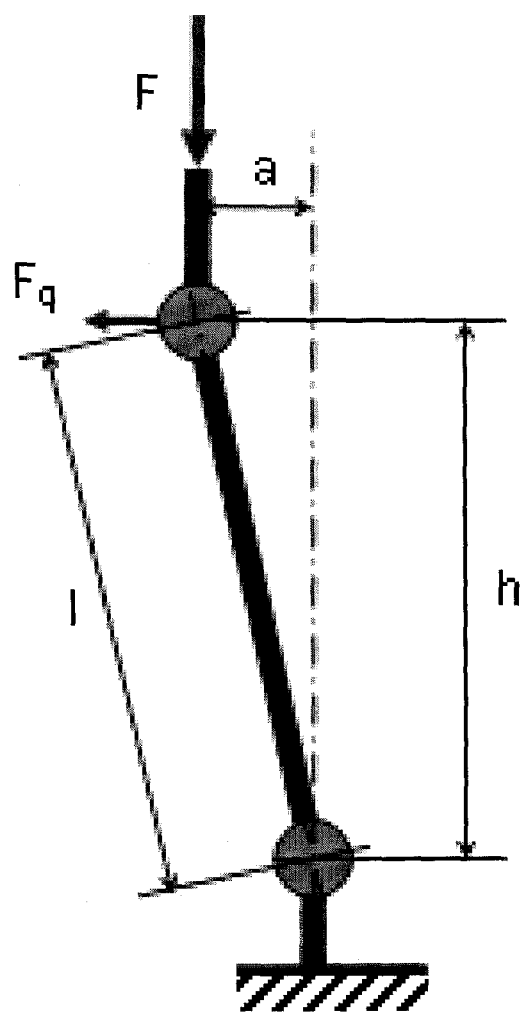

As is illustrated in FIG. 11, in practice upon application of a force or axial loading to such a pin in conjunction with a lateral deflection there now occurs a transverse force $F_q$ as a result of a "pendulum effect" and moments as a result of the restoring effect/bending stiffness of the deflected joints, which can cause e.g. deformations of the mirror 101 and is therefore undesirable in principle. This parasitic transverse force can be described mathematically with reference to the variables defined in FIG. 11, as follows:

$$F*a = F_q*h \quad (2)$$

$$F_q = \frac{F*a}{h} \quad (3)$$

$$l^2 = h^2 + a^2 \quad (4)$$

In this case, F denotes the force exerted on the pin 910, 1 denotes the distance between the two universal joints of the pin, a denotes the maximum lateral deflection of the pin (or the maximum distance between the laterally deflected pin and the z-axis) and h denotes the length of the projection of the connection path between the two universal joints onto the z-axis.

Although, as is directly evident from equation (3), one possible approach for reducing the transverse force consists in increasing the length of the pin (or the distance between the two universal joints), this is possible only to a limited extent with regard to the restricted structural space.

An explanation is given below, with reference to FIGS. 12a-12b of embodiments of the invention which enable the transverse forces described above to be reduced and ideally completely eliminated.

In this case, according to the invention, in order to reduce the transverse force, use is made of the magnetic circuit already present in the weight force compensation device explained in the embodiments described above, the magnetic circuit being composed of two magnets situated on the inside in the radial direction and one magnet situated on the outside in the radial direction. This is effected in a manner such that the magnetic circuit, by suitable configuration of the guides of the magnets, not only generates a force acting in the vertical direction, but also, as described below, generates forces or moments which act in other directions and which are directed exactly opposite to the transverse force $F_q$ and are suitable for the compensation thereof.

In this case, the invention is based on the concept, for instance proceeding from the construction from FIG. 8, of deliberately making it possible to displace the magnets 831, 832 situated on the inside in the radial direction relative to the magnets 833 situated on the outside in the radial direction and of using this movement or the in principle parasitic forces associated therewith in as much as the transverse forces generated thereby at least partly compensate for the parasitic transverse force $F_q$ acting on the pin 810.

Figure 12A:
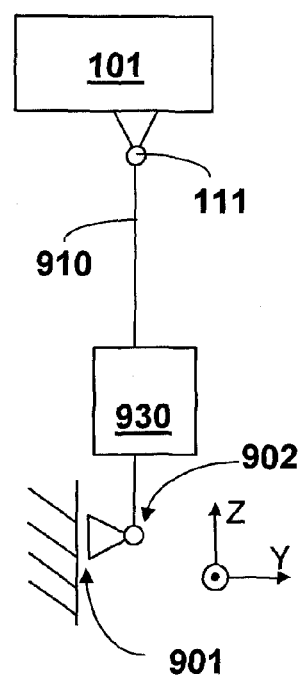
Figure 12B:
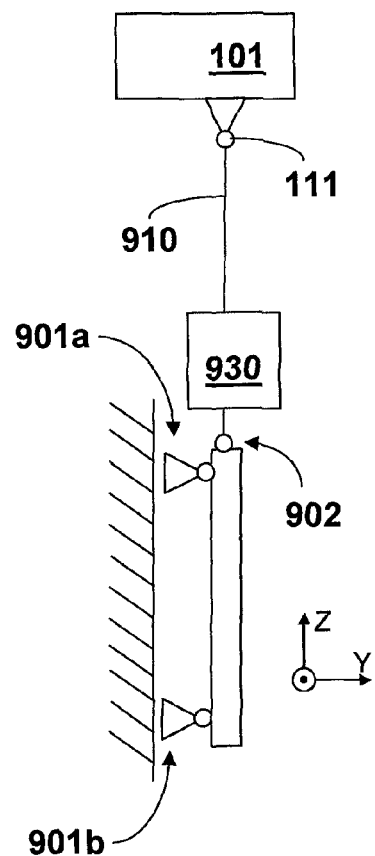

For elucidation purposes, FIGS. 12a and 12b firstly show schematic basic diagrams. In accordance with FIG. 12a, in principle the transverse force compensation according to the invention is achieved by virtue of the fact that an axial guide 901 (symbolized in FIG. 12a by the gap or distance between the system, assumed to be stationary, and the linking point) and a rotary joint 902 are provided on that side of the weight force compensation device 930 which faces away from the mirror 101.

In an embodiment illustrated schematically in FIG. 12b, it is possible to use, in particular, a combination of a parallel guide 901 and a universal or cardan joint 902, wherein the parallel guide 901 can be formed e.g. by two leaf springs 901a, 901b having e.g. the construction described with reference to FIGS. 5a and 5b, and FIGS. 6a and 6b, respectively.

In a further embodiment, it is possible to provide, for instance, a suitable leaf spring element configured such that, in order to obtain the compensation described above, both a deflection movement along the z-axis and a tilting about the x- or y-axis are permitted. For this purpose, the leaf spring elements can be configured as shown in FIGS. 5a, 5b, 6a and 6b, as a result of which the required degrees of freedom can be provided. In accordance with a further possible configuration, it is also possible to provide an axial guide as in the case of the weight force compensation device, in which two leaf spring joints as shown in FIGS. 5a, 5b, 6a and 6b are connected in series with an additional cardan joint.

The specific arrangement of the components shown in FIGS. 12a-12b is dependent on whether the relevant mirror 101 is arranged in a manner standing or suspended in the system.

Figure 13A:
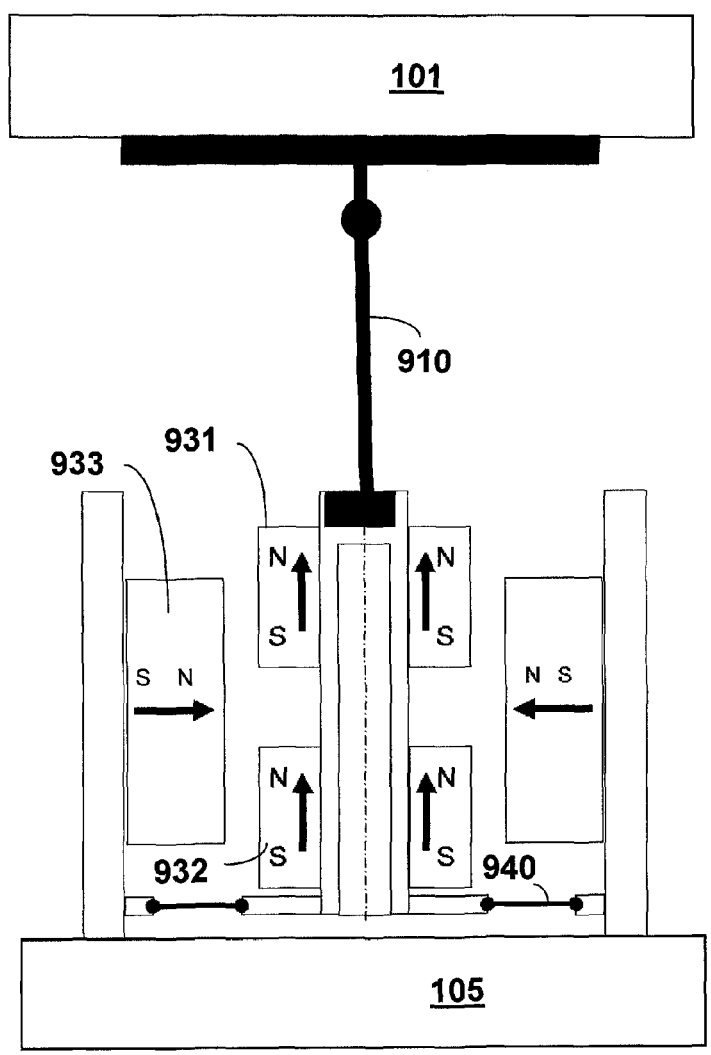

FIG. 13a firstly shows a specific exemplary embodiment of a standing mirror arrangement. In accordance with FIG. 13a, analogously to the construction from FIG. 8, two magnets 931, 932 situated on the inside in the radial direction form the moved mass of the weight force compensation device, and the outer magnet 933 in the radial direction forms the stationary part with respect to the optical system.

In contrast to the construction from FIG. 8, however, in which the magnets 831, 832 situated on the inside in the radial direction perform only a movement in the axial direction or z-direction on account of the two leaf spring elements 821, 822, the arrangement in accordance with FIG. 13a is configured such that, in addition to an axial displacement in the z-direction, a torsion or tilting about the y- or x-axis (or another axis of rotation lying in the x-y plane) is also permitted, a sufficient stiffness simultaneously being present relative to displacements laterally or in the radial direction.

For this purpose, the linking of the moved mass of the weight force compensation device is effected in accordance with the diagram from FIG. 12a via a suitable leaf spring element 940 configured such that both a deflection movement along the z-axis and a tilting about the x- or y-axis are permitted.

Figure 13B:
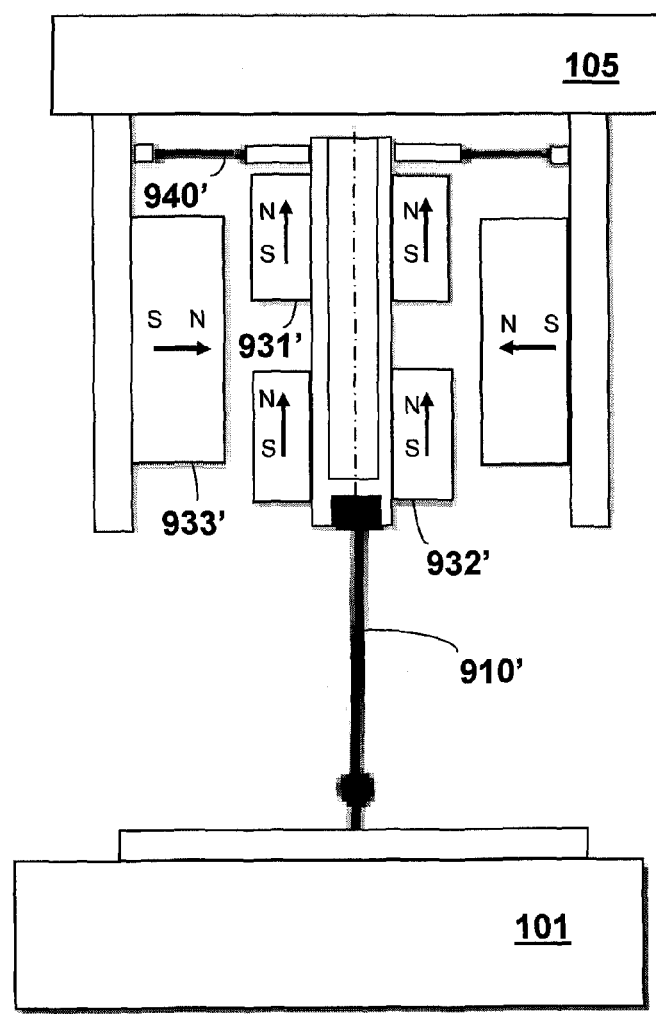

FIG. 13b shows a further exemplary embodiment, which, in principle, is analogous to the example from FIG. 13a but intended for a suspended mirror arrangement (such that the mirror 101 is arranged "at the bottom" in FIG. 13b). Analogously to the arrangement from FIG. 13a, in FIG. 13b the linking of the moved mass of the weight force compensation device or of the magnets 931, 932 lying radially on the inside to the frame 105 or the stationary optical system is situated on that side of the weight force compensation device 930 which faces away from the mirror 101.

Generally, the linking of the moved mass of the weight force compensation device or of the magnets 931, 932 lying radially on the inside to the frame 105 or the stationary optical system is effected in such a way as to result in a compensation of the transverse force $F_q$ acting on the pin.

Figure 14:
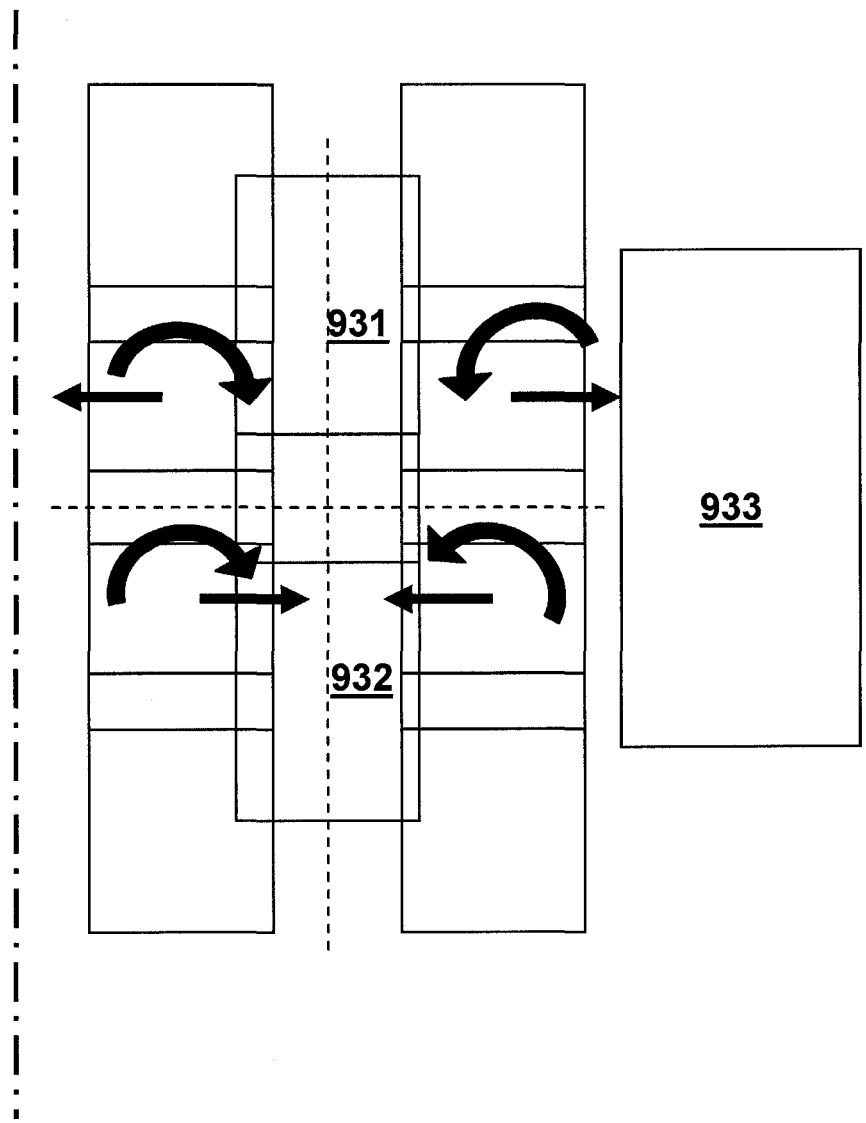

For illustration purposes, FIG. 14 indicates merely schematically the respectively resulting forces and moments in the case of a displacement (not effected solely along the z-axis) of the moved mass of the weight force compensation device or of the magnets 931, 932 lying radially on the inside relative to the frame 105 or the stationary optical system. If, by way of example, in FIG. 14, the moved mass of the weight force compensation device is displaced "obliquely upward" or "obliquely downward", then the forces indicated by rectilinear arrows in FIG. 14 and the moments indicated by curved arrows respectively have an effect (their magnitude being dependent in each case on the leverage ratios). In this case, it is assumed that in the starting position or zero position of the pin 910, ideally no transverse force arises (since the latter is generated only upon deflection relative to the z-axis). According to the invention, the transverse force is now used, as described above, to compensate for the described transverse force $F_q$ acting on the pin 910.

Calculations show that this measure can yield reductions in the parasitic transverse force $F_q$ which are of the order of magnitude of 30% or more.

A further advantage of the embodiments described with reference to FIGS. 12a-12b-13a-13b-14 is that only a single rotary joint (which is designated by 111 in FIG. 12a and FIG. 12b) is situated between the moved mass of the weight force compensation device or the magnets 931, 932 lying radially on the inside, on the one hand, and the mirror 101, on the other hand, in contrast for instance to the embodiment from FIG. 8, which has the consequence that overall the natural frequencies and stiffnesses sought can be achieved more simply compared with an arrangement composed of two rotary joints in the region between moved mass of the weight force compensation device and mirror (the axial stiffness becomes significantly higher on account of the omission of a joint, such that the remaining universal joint can be adapted correspondingly more simply).

The invention further relates to an arrangement for mounting an optical element as defined in the following Clauses:

1. Arrangement for mounting an optical element, in particular in an EUV projection exposure apparatus, comprising a weight force compensation device for exerting a compensation force on the optical element, wherein the compensation force at least partly compensates for the weight force acting on the optical element, and at least two actuators which each exert a controllable force on the optical element, wherein at least one of the actuators generates the controllable force on the optical element in the direction of the compensation force.
2. Arrangement according to Clause 1, characterized in that the at least one actuator is integrated into the weight force compensation device.
3. Arrangement according to Clause 1 or 2, characterized in that the weight force compensation device has a passive magnetic circuit for generating a constant force component of the compensation force acting on the optical element.
4. Arrangement according to any of Clauses 1 to 3, characterized in that the actuator acting in the direction of the compensation force, or the weight force compensation device, has at least one coil to which an electric current can be applied and which serves for generating an actively controllable force transmitted to the optical element via at least one movable actuator element.
5. Arrangement according to Clause 3 and 4, characterized in that the at least one movable actuator element is a magnet belonging to the passive magnetic circuit.
6. Arrangement according to any of the preceding Clauses, characterized in that the optical element is a mirror.
7. Arrangement according to any of Clauses 3 to 6, characterized in that the magnetic force compensation device has an adjustment ring, which is displaceable in an axial direction relative to the drive direction, wherein the force exerted by the passive magnetic circuit can be manipulated by displacement of the adjustment ring.
8. Arrangement according to any of the preceding Clauses, characterized in that a mechanical coupling is formed between at least one of the actuators and the optical element in a manner such that, relative to the drive axis of the actuator, the ratio of the stiffness of the mechanical coupling in an axial direction to the stiffness in a lateral direction is at least 100.
9. Arrangement according to any of the preceding Clauses, characterized in that a mechanical coupling is formed between at least one of the actuators and the optical element in a manner such that, for the mechanical coupling, the natural frequency in an axial direction is at least three times the bandwidth of the regulation.
10. Arrangement according to any of the preceding Clauses, characterized in that a mechanical coupling is formed between at least one of the actuators and the optical element in a manner such that, for the mechanical coupling, the natural frequency in an axial direction is in the range of 600 Hz to 1800 Hz, in particular in the range of 800 Hz to 1400 Hz, more particularly in the range of 1000 Hz to 1200 Hz.
11. Arrangement for mounting an optical element, in particular in an EUV projection exposure apparatus, comprising at least two actuators which each exert a controllable force on the optical element, wherein a mechanical coupling is formed between at least one of the actuators and the optical element in a manner such that, relative to the drive axis of the actuator, the ratio of the stiffness of the mechanical coupling in an axial direction to the stiffness in a lateral direction is at least 100.
12. Arrangement for mounting an optical element, in particular in an EUV projection exposure apparatus, comprising at least two actuators which each exert a controllable force on the optical element, wherein a mechanical coupling is formed between at least one of the actuators and the optical element in a manner such that, for the mechanical coupling, the natural frequency in an axial direction is in the range of 600 Hz to 1800 Hz, in particular in the range of 800 Hz to 1400 Hz, more particularly in the range of 1000 Hz to 1200 Hz.
13. Arrangement according to any of Clauses 8 to 12, characterized in that the mechanical coupling has a pin provided with two universal joints.
14. Arrangement according to Clause 13, characterized in that the pin has a first partial element, in which one of the two universal joints is formed, and also a second partial element, which is connected to the first partial element in a releasable manner and in which the other of the two universal joints is formed.
15. Arrangement according to Clause 14, characterized in that the first partial element is fixedly fitted to the mirror.
16. Arrangement according to any of Clauses 13 to 15, characterized in that at least one of the two universal joints is embodied in a hollow fashion in regions.
17. Arrangement according to any of the preceding Clauses, characterized in that a movable actuator component of at least one of the actuators is mechanically coupled to a non-movable actuator component of the actuator via a parallel spring system.
18. Arrangement according to Clause 17, characterized in that, for the mechanical coupling, the ratio of the stiffness in a lateral direction to the stiffness in an axial direction is at least 3000, in particular at least 6000, more particularly at least 9000.
19. Arrangement according to Clause 17 or 18, characterized in that the parallel spring system has an arrangement composed of two leaf springs, which have in each case bending beams arranged tangentially relative to the drive axis of the actuator.
20. Arrangement according to Clause 19, characterized in that at least one of the leaf springs has bending beams running in a radial direction relative to the drive axis of the actuator.
21. Arrangement for mounting an optical element in an optical system, in particular in an EUV projection exposure apparatus, comprising a weight force compensation device for exerting a compensation force on the optical element, wherein the compensation force at least partly compensates for the weight force acting on the optical element, wherein the weight force compensation device has at least one magnet which is movable relative to a stationary frame of the optical system and at least one magnet which is stationary relative to the frame, and wherein the at least one magnet which is movable relative to the frame is mounted in movable fashion in a direction that deviates from the direction of the compensation force.
22. Arrangement according to Clause 21, characterized in that the weight force compensation device is mechanically coupled to the optical element via a pin.
23. Arrangement according to Clause 22, characterized in that the at least one magnet which is movable relative to the frame is mounted in movable fashion in a direction non-parallel to the longitudinal axis of the pin.
24. Arrangement according to Clause 22 or 23, characterized in that a deflection of the pin in a direction that deviates from the direction of the compensation force leads to a relative movement between the magnet which is movable relative to the frame and the magnet which is stationary relative to the frame.
25. Arrangement according to Clause 24, characterized in that the relative movement generates a magnetic moment which at least partly compensates for a transverse force acting on the pin in a direction that deviates from the direction of the compensation force.
26. Arrangement according to any of the Clauses 21 to 25, characterized in that a mechanical coupling is provided between the frame and the magnet which is movable relative to the frame, the mechanical coupling enabling both an axial displacement of the magnet which is movable relative to the frame in the direction of the weight force and a tilting of the magnet which is movable relative to the frame about a rotational axis perpendicular to the direction of the weight force.
27. Arrangement according to Clause 26, characterized in that the mechanical coupling has an axial guide and a rotary joint.
28. Arrangement according to Clause 27, characterized in that the axial guide is formed by a parallel spring system composed of two leaf springs.
29. Arrangement according to Clause 26, characterized in that the mechanical coupling has a spring element, which enables both an axial displacement of the magnet which is movable relative to the frame in the direction of the weight force and a tilting of the magnet which is movable relative to the frame about at least one rotational axis perpendicular to the direction of the weight force.
30. Arrangement according to Clause 29, characterized in that the mechanical coupling formed by the spring element has a natural frequency in the axial direction in the range of 600 Hz to 1800 Hz, in particular in the range of 800 Hz to 1400 Hz, more particularly in the range of 1000 Hz to 1200 Hz.
31. Arrangement according to any of Clauses 22 to 30, characterized in that the pin has two universal joints.
32. Arrangement according to any of Clauses 21 to 31, characterized in that the optical element is a mirror.

Even though the invention has been described on the basis of specific embodiments, numerous variations and alternative embodiments, e.g. through combination and/or exchange of features of individual embodiments, are evident to the person skilled in the art. Accordingly, for the person skilled in the art it goes without saying that such variations and alternative embodiments are concomitantly encompassed by the present invention, and the scope of the invention is restricted only within the meaning of the accompanying patent claims and the equivalents thereof.

The invention claimed is:
1. An arrangement, comprising:
a weight force compensation device configured to exert a compensation force on an optical element to at least partly compensate a weight force acting on the optical element; and
an adjustment element completely surrounding the weight force compensation device,
wherein:
the weight force compensation device comprises a passive magnetic circuit configured to generate a force component of the compensation force; and
the adjustment element is configured so that the force component of the compensation force is continuously adjustable.
2. The arrangement of claim 1, wherein the adjustment element is displaceable in an axial direction relative to a direction of the compensation force, and the force component is manipulable via the displacement.
3. The arrangement of claim 1, wherein the adjustment element comprises a soft magnetic material.
4. The arrangement of claim 1, wherein the adjustment element comprises a permanent magnet.
5. The arrangement of claim 1, wherein the adjustment element comprises a coil configured to have an electric current applied thereto.
6. The arrangement of claim 1, wherein the adjustment element has a ring-shaped geometry.
7. The arrangement of claim 1, further comprising a control system, wherein a position of the adjustment element is controllable via the control system depending on at least one operation parameter of the arrangement.

8. The arrangement of claim 7, wherein a temperature-induced or ageing-induced change of the compensation force is reducable compared to an analogous arrangement without the control system.

9. The arrangement of claim 1, further comprising at least two actuators configured to exert a controllable force on the optical element, wherein at least one of the at least two actuators is configured to generate the controllable force on the optical element in a direction of the compensation force.

10. The arrangement of claim 9, wherein the at least one actuator is integral with the weight force compensation device.

11. The arrangement of claim 9, wherein the at least one actuator or the weight force compensation device comprises a coil to which an electric current is applicable and which is capable of generating an actively controllable force transmitted to the optical element via at least one movable actuator element.

12. The arrangement of claim 11, wherein the at least one movable actuator element comprises a magnet which is an element of a passive magnetic circuit.

13. The arrangement of claim 9, comprising a mechanical coupling between at least one of the actuators and the optical element so that, relative to a drive axis of the at least one actuator, a ratio of a stiffness of the mechanical coupling in an axial direction to a stiffness of the mechanical coupling in a lateral direction is at least 100.

14. The arrangement of claim 13, wherein the mechanical coupling comprising a pin comprising first and second universal joints.

15. The arrangement of claim 14, wherein the pin comprises a first partial element comprising the first universal joint, a second partial element connected to the first partial element in a releasable manner, and the second partial element comprises the second universal joint.

16. The arrangement of claim 15, wherein the first partial element is fixedly fitted to the optical element.

17. The arrangement of claim 14, wherein the first universal joint has hollow regions.

18. The arrangement of claim 9, comprising a mechanical coupling between at least one of the actuators and the optical element so that that the mechanical coupling has a natural frequency in an axial direction which in a range of 600 Hz to 1800 Hz.

19. The arrangement of claim 9, wherein at least one of the actuators comprises a movable actuator component and a non-movable actuator component, and the movable actuator component is mechanically coupled to the non-movable actuator component via a parallel spring system.

20. The arrangement of claim 19, wherein the mechanical coupling has a ratio of a stiffness in a lateral direction to a stiffness in an axial direction of at least 3000.

21. The arrangement of claim 19, wherein the parallel spring system comprises an arrangement comprising two leaf springs, each leaf spring comprising bending beams arranged tangentially relative to a drive axis of the at least one actuator.

22. The arrangement of claim 21, wherein at least one of the leaf springs comprises bending beams that run in a radial direction relative to the drive axis of the at least one actuator.

23. The arrangement of claim 1, wherein the optical element comprises a mirror.

24. The arrangement of claim 1, further comprising the optical element.

25. A lens, comprising:
an optical element;
a weight force compensation device configured to exert a compensation force on the optical element to at least partly compensate a weight force acting on the optical element, the weight force compensation device comprising a passive magnetic circuit configured to generate a force component of the compensation force; and
an adjustment element configured so that the force component of the compensation force is continuously adjustable,
wherein:
the adjustment element completely surrounds the weight force compensation device; and
the lens is an EUV projection lens.

26. An apparatus, comprising:
an illumination device; and
a projection lens, comprising:
an optical element; and
a weight force compensation device configured to exert a compensation force on the optical element to at least partly compensate a weight force acting on the optical element, the weight force compensation device comprising a passive magnetic circuit configured to generate a force component of the compensation force; and
an adjustment element configured so that the force component of the compensation force is continuously adjustable,
wherein:
the adjustment element completely surrounds the weight force compensation device; and
the apparatus is an EUV projection exposure apparatus.

27. An arrangement, comprising:
a weight force compensation device configured to exert a compensation force on an optical element to at least partly compensate a weight force acting on the optical element; and
an adjustment element at least partly surrounding the weight force compensation device,
wherein:
the weight force compensation device comprises a passive magnetic circuit configured to generate a force component of the compensation force;
the adjustment element comprises a soft magnetic material; and
the adjustment element is configured so that the force component of the compensation force is continuously adjustable.

* * * * *

UNITED STATES PATENT AND TRADEMARK OFFICE
CERTIFICATE OF CORRECTION

PATENT NO. : 9,448,384 B2  
APPLICATION NO. : 13/903563  
DATED : September 20, 2016  
INVENTOR(S) : Michael Erath et al.

Page 1 of 1

It is certified that error appears in the above-identified patent and that said Letters Patent is hereby corrected as shown below:

On the Title Page

Page 3, Column 2, Line 7, in item (56) under "OTHER PUBLICATIONS", delete "an" and insert -- and --.

In the Claims

Column 23, Line 5, Claim 8, delete "reducable" and insert -- reducible --.

Column 23, Line 44, Claim 18, delete "that that" and insert -- that --.

Signed and Sealed this  
Twenty-first Day of February, 2017

Michelle K. Lee  
*Director of the United States Patent and Trademark Office*